United States Patent
Kobayashi

(10) Patent No.: US 11,133,815 B2
(45) Date of Patent: Sep. 28, 2021

(54) RESAMPLING CIRCUIT, PHYSICAL QUANTITY SENSOR UNIT, INERTIAL MEASUREMENT UNIT, AND STRUCTURE MONITORING DEVICE

(71) Applicant: Seiko Epson Corporation, Tokyo (JP)

(72) Inventor: Yoshihiro Kobayashi, Komagane (JP)

(73) Assignee: Seiko Epson Corporation

( * ) Notice: Subject to any disclaimer, the term of this patent is extended or adjusted under 35 U.S.C. 154(b) by 323 days.

(21) Appl. No.: 16/395,577

(22) Filed: Apr. 26, 2019

(65) Prior Publication Data

US 2019/0334540 A1    Oct. 31, 2019

(30) Foreign Application Priority Data

Apr. 27, 2018 (JP) .............. JP2018-086189

(51) Int. Cl.
  *H03M 1/00*    (2006.01)
  *H03M 1/12*    (2006.01)
  *G01C 9/06*    (2006.01)

(52) U.S. Cl.
  CPC ............ *H03M 1/1245* (2013.01); *G01C 9/06* (2013.01)

(58) Field of Classification Search
  CPC .... H03M 1/1245; H03M 1/125; H03M 1/127; H03M 1/1285; G01C 9/06
  USPC .............. 341/122, 61, 144; 73/493
  See application file for complete search history.

(56) References Cited

U.S. PATENT DOCUMENTS

| | | | |
|---|---|---|---|
| 6,892,576 B2 | 5/2005 | Samuels et al. | |
| 7,956,621 B2 | 6/2011 | Hollocher et al. | |
| 8,472,270 B2 | 6/2013 | Samuels et al. | |
| 8,665,627 B2 | 3/2014 | Lee et al. | |
| 8,917,099 B2 | 12/2014 | Hollocher et al. | |
| 9,041,462 B2 | 5/2015 | Genik | |
| 9,297,825 B2 | 3/2016 | Zhang et al. | |
| 2012/0068866 A1* | 3/2012 | Robinson ............ | H03M 1/0836 341/118 |

(Continued)

FOREIGN PATENT DOCUMENTS

| | | |
|---|---|---|
| JP | H05-091287 A | 4/1993 |
| JP | 2018-092392 A | 6/2018 |
| JP | 2018-141659 A | 9/2018 |

OTHER PUBLICATIONS

U.S. Appl. No. 16/395,525, filed Apr. 26, 2019, Yoshihiro Kobayashi.

*Primary Examiner* — Peguy Jean Pierre
(74) *Attorney, Agent, or Firm* — Harness, Dickey & Pierce, P.L.C.

(57) ABSTRACT

A resampling circuit converts first data updated synchronously with a first clock signal into second data updated synchronously with a second clock signal asynchronous with the first clock signal and outputs the second data. The resampling circuit measures a first time interval between a plurality of successive edges of the first clock signal, and a second time interval between one of the plurality of edges of the first clock signal and an edge of the second clock signal, with a third clock signal having a higher frequency than the first clock signal and the second clock signal. The resampling circuit calculates and outputs the second data updated at the edge of the second clock signal, based on the first time interval and the second time interval, and a plurality of the first data updated at the plurality of edges of the first clock signal.

12 Claims, 14 Drawing Sheets

(56) References Cited

U.S. PATENT DOCUMENTS

2013/0101068 A1    4/2013  Mombers et al.
2020/0136794 A1*  4/2020  Andrade Alfonseca ............... H04L 7/048

* cited by examiner

RESAMPLING CIRCUIT, PHYSICAL QUANTITY SENSOR UNIT, INERTIAL MEASUREMENT UNIT, AND STRUCTURE MONITORING DEVICE

The present application is based on and claims priority from JP Application Serial Number 2018-086189, filed Apr. 27, 2018, the disclosure of which is hereby incorporated by reference herein in its entirety.

BACKGROUND

1. Technical Field

The present disclosure relates to a resampling circuit, a physical quantity sensor unit, an inertial measurement unit, and a structure monitoring device.

2. Related Art

An inertial measurement unit (IMU) or a physical quantity sensor unit which measures a certain physical quantity such as acceleration or angular velocity converts a signal corresponding to the magnitude of a measurement target physical quantity from analog to digital, then performs various kinds of signal processing such as correction and conversion to generate measurement data, and outputs the measurement data to an arithmetic processing device (host). Generally, the measurement data is outputted synchronously with an external trigger signal supplied from the arithmetic processing device asynchronously with the sampling rate of A/D conversion, and A/D conversion is carried out at a higher frequency than the output rate of the measurement data. Therefore, the IMU or physical quantity sensor unit is provided with a resampling circuit which converts the sampling rate at the time of A/D conversion to the output rate of the measurement data.

JP-A-5-91287 discloses a technique of converting a sampling rate by performing interpolation with the lowest common multiple of two sampling rates, then smoothing via a digital filter, and decimating the result.

JP-A-5-91287 is an example of the related art.

However, in the technique disclosed in JP-A-5-91287, when two sampling rates are asynchronous, a periodic noise may be generated in output data due to a periodic resampling error.

SUMMARY

A resampling circuit according to an aspect of the present disclosure is a resampling circuit that converts first data updated synchronously with a first clock signal into second data updated synchronously with a second clock signal asynchronous with the first clock signal and outputs the second data. The resampling circuit measures a first time interval, which is a time interval between a plurality of successive edges of the first clock signal, and a second time interval, which is a time interval between one of the plurality of edges of the first clock signal and an edge of the second clock signal, with a third clock signal having a higher frequency than the first clock signal and the second clock signal. The resampling circuit calculates and outputs the second data updated at the edge of the second clock signal, based on the first time interval and the second time interval, and a plurality of the first data updated at the plurality of edges of the first clock signal.

In the resampling circuit according to the aspect of the present disclosure, a first edge of the plurality of edges of the first clock signal may occur before the edge of the second clock signal. A second edge of the plurality of edges of the first clock signal may occur after the edge of the second clock signal. The second time interval may be a time interval between the first edge and the edge of the second clock signal.

In the resampling circuit according to the aspect of the present disclosure, a first edge of the plurality of edges of the first clock signal may occur before the edge of the second clock signal. A second edge of the plurality of edges of the first clock signal may occur after the first edge and before the edge of the second clock signal. The second time interval may be a time interval between the second edge and the edge of the second clock signal.

In the resampling circuit according to the aspect of the present disclosure, the second data updated at the edge of the second clock signal may be calculated by approximation based on a relation between the first time interval and the second time interval, and a plurality of the first data updated at the plurality of edges of the first clock signal.

In the resampling circuit according to the aspect of the present disclosure, the approximation may be linear approximation.

The resampling circuit according to the aspect of the present disclosure may include a low-pass filter which outputs the first data. A cutoff frequency of the low-pass filter may be lower than a Nyquist frequency of the second clock signal.

In the resampling circuit according to the aspect of the present disclosure, the first clock signal may be a sampling clock in A/D conversion.

In the resampling circuit according to the aspect of the present disclosure, the second clock signal may be a trigger signal inputted from outside to the resampling circuit.

A physical quantity sensor unit according to an aspect of the present disclosure includes: the resampling circuit of one of the foregoing configurations; and a physical quantity sensor.

In the physical quantity sensor unit according to the aspect of the present disclosure, the physical quantity sensor may detect at least one of acceleration and angular velocity.

An inertial measurement unit according to an aspect of the present disclosure includes: a physical quantity sensor which detects at least one of acceleration and angular velocity; a signal processing circuit which includes the resampling circuit of one of the foregoing configurations and processes a signal outputted from the physical quantity sensor; and a communication circuit which transmits inertial data resulting from the processing by the signal processing circuit to outside.

A structure monitoring device according to an aspect of the present disclosure includes: the physical quantity sensor unit of one of the foregoing configurations; a receiver which receives a detection signal from the physical quantity sensor unit installed on a structure; and a calculator which calculates an angle of inclination of the structure, based on a signal outputted from the receiver.

DESCRIPTION OF EXEMPLARY EMBODIMENTS

Embodiments of the present disclosure will now be described in detail with reference to the drawings. The embodiments described below should not unduly limit the content of the present disclosure described in the appended claims. Not all the elements described below are essential elements of the present disclosure.

1. Resampling Circuit

Hereinafter, each embodiment is described, taking, as an example, a resampling circuit which has an A/D-converted measurement target signal, converts digital data (hereinafter referred to as "AD data") updated synchronously with a sampling clock (hereinafter referred to as "AD clock") in the A/D conversion into measurement data updated synchronously with an externally inputted trigger signal (hereinafter referred to as "external trigger") asynchronous with the AD clock, and outputs the measurement data. The A/D conversion of the measurement target signal may be, for example, converting the voltage of the measurement target signal into digital data or converting the frequency of the measurement target signal into digital data. The resampling circuit converts the AD data into the measurement data, using a clock (hereinafter referred to as "high-frequency clock") having a higher frequency than the AD clock and the external trigger. In the description below, the external trigger and the AD clock are asynchronous with each other. The frequency of the AD clock is higher than the frequency of the external trigger. The frequency of the high-frequency clock is sufficiently higher than the frequency of the AD clock. The high-frequency clock may be synchronous or asynchronous with the AD clock or the external trigger.

The AD clock is an example of the "first clock signal" according to the present disclosure. The external trigger is an example of the "second clock signal" according to the present disclosure. The high-frequency clock is an example of the "third clock signal" according to the present disclosure. The AD data is an example of the "first data" according to the present disclosure. The measurement data is an example of the "second data" according to the present disclosure.

1-1. First Embodiment

Figure 1:
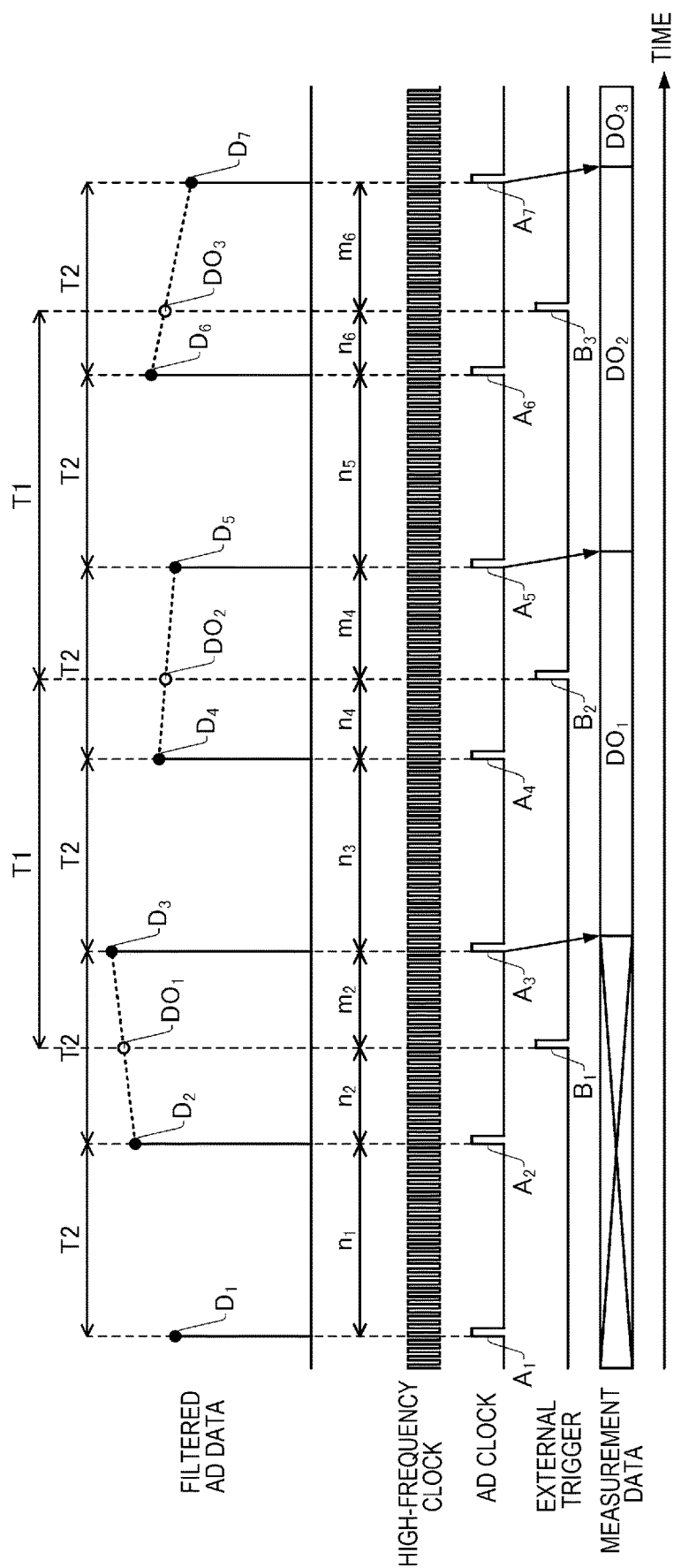
FIG. 1 illustrates an outline of processing in a resampling circuit according to a first embodiment.

FIG. 1 illustrates an outline of processing in a resampling circuit according to a first embodiment. In FIG. 1, an edge of an external clock comes every period T1 and an edge of an AD clock comes every period T2. An edge $B_1$ of the external trigger comes between two successive edges $A_2$, $A_3$ of the AD clock. The edge $A_2$ occurs before the edge $B_1$. The edge $A_3$ occurs after the edge $B_1$. An edge $B_2$ of the external trigger comes between two successive edges $A_4$, As of the AD clock. The edge $A_4$ occurs before the edge $B_2$. The edge $A_5$ occurs after the edge $B_2$. Similarly, an edge $B_3$ of the external trigger comes between two successive edges $A_6$, $A_v$ of the AD clock. The edge $A_g$ occurs before the edge $B_3$. The edge $A_7$ occurs after the edge $B_3$. The edges $A_2$, $A_4$, $A_6$ are an example of the "first edge" according to the present disclosure. The edges $A_3$, As, $A_7$ are an example of the "second edge" according to the present disclosure.

The resampling circuit of the first embodiment calculates a resampled value $DO_i$ at an edge $B_i$ by the following interpolation-based linear approximation formula (1), based on the relation between a first time interval $n_k+m_k$, which is the time interval between two successive edges $A_k$, $A_{k+1}$ of the AD clock with an edge $B_i$ of the external trigger coming in-between, and a second time interval $n_k$, which is the time interval between the edge $A_k$ and the edge $B_i$, and two values $D_k$, $D_{k+1}$ of the AD data updated at the two edges $A_k$, $A_{k+1}$.

$$DO_i = D_k + (D_{k+1} - D_k) \times \frac{n_k}{n_k + m_k} \qquad (1)$$

The resampling circuit of the first embodiment then outputs measurement data having resampled values $DO_1$, $DO_2$, $DO_3$, ... every period T1 of the external trigger.

Figure 2:
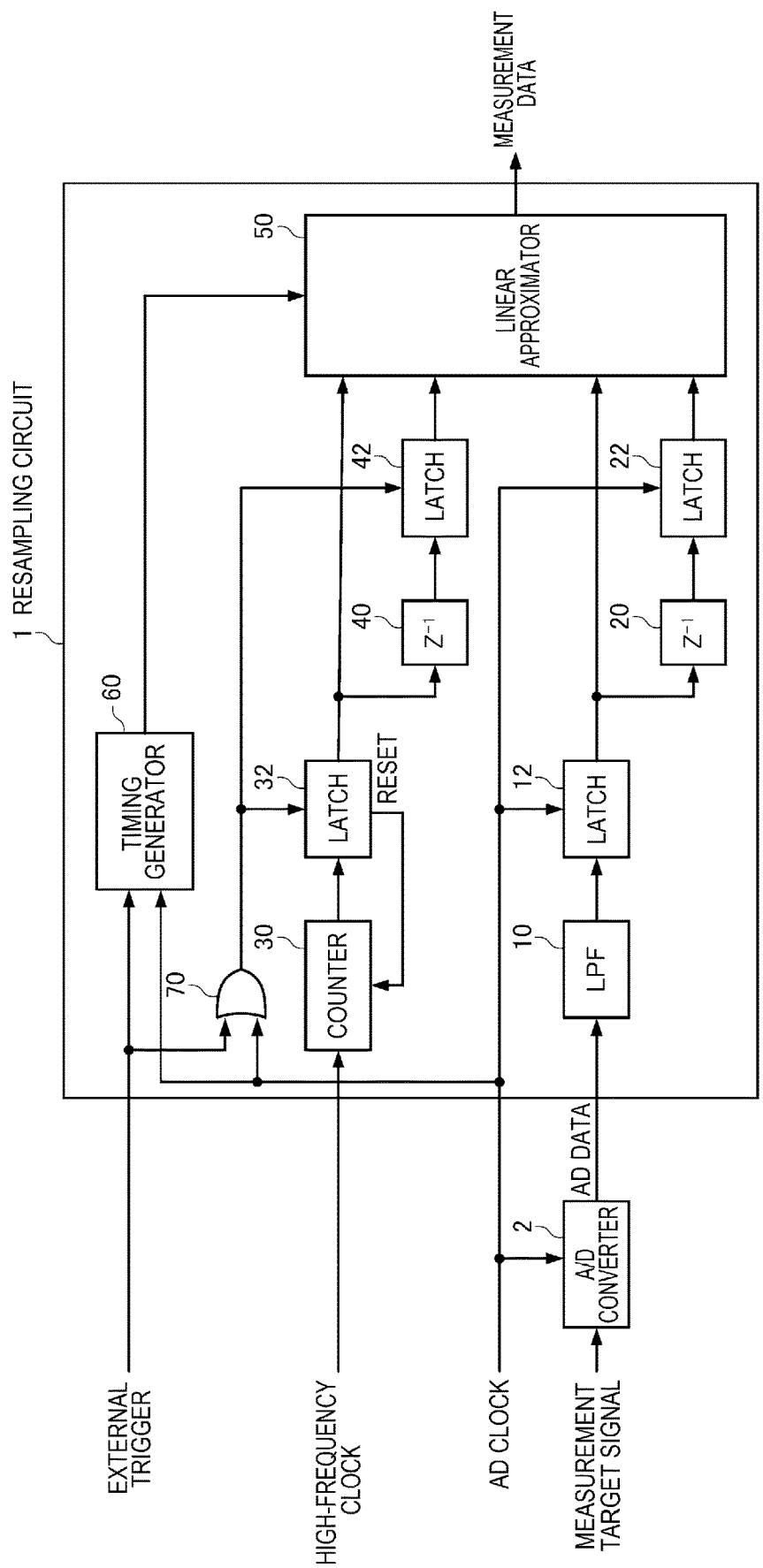
FIG. 2 shows an example of the configuration of the resampling circuit according to the first embodiment.

FIG. 2 shows an example of the configuration of the resampling circuit of the first embodiment. As shown in FIG. 2, a resampling circuit 1 of the first embodiment includes a low-pass filter 10, a latch 12, a delay ($Z^{-1}$) 20, a latch 22, a counter 30, a latch 32, a delay ($Z^{-1}$) 40, a latch 42, a linear approximator 50, a timing generator 60, and an OR circuit 70.

To the low-pass filter (LPF) 10, AD data resulting from A/D-converting a measurement target signal by an A/D converter 2 outside the resampling circuit 1 is inputted. The low-pass filter 10 filters the AD data and thus damps a high-range noise. For example, the low-pass filter 10 is implemented by a digital filter such as a FIR (finite impulse response) filter or IIR (infinite impulse response) filter.

The latch 12 takes in and holds the AD data outputted from the low-pass filter 10 at every edge of the AD clock. The edge of the AD clock at which the latch 12 takes in the data may be a rising edge or a falling edge according to need. For example, the latch 12 is implemented by a register made up of a predetermined number of D flip-flops.

The delay 20 delays the data held by the latch 12 and outputs the delayed data. The latch 22 takes in and holds the data outputted from the delay 20 at every edge of the AD clock. The edge of the AD clock at which the latch 22 takes in the data may be the same as the edge of the AD clock at which the latch 12 takes in the data. For example, the delay 20 and the latch 22 are implemented by a register made up of a predetermined number of D flip-flops.

The OR circuit 70 has the external trigger and the AD clock inputted thereto and outputs an OR signal of these.

The counter 30 counts the number of edges of the high-frequency clock when a reset signal from the latch 32 is inactive (for example, low-level). The counter 30 initializes the count value to zero when the reset signal from the latch 32 is active (for example, high-level). The counter 30 may count the number of rising edges of the high-frequency clock, the number of falling edges of the high-frequency clock, or the number of rising edges and falling edges of the high-frequency clock, according to need.

The latch 32 takes in and holds the count value from the counter 30 at every edge of the OR signal outputted from the OR circuit 70, that is, every time an edge of the external trigger or an edge of the AD clock comes. The latch 32 also turns the reset signal active for a predetermined time and supplies the reset signal to the counter 30. For example, the latch 32 is implemented by a register made up of a predetermined number of D flip-flops.

The delay 40 delays the value held by the latch 32 and outputs the delayed value. The latch 42 takes in and holds the value outputted from the delay 40 at every edge of the OR signal outputted from the OR circuit 70. For example, the delay 40 and the latch 42 are implemented by a register made up of a predetermined number of D flip-flops.

The timing generator 60 outputs a control signal which turns active for a predetermined time after the timing of an edge of the AD clock following the arrival of an edge of the external trigger. In the example of FIG. 1, the control signal turns active at the edges edge $A_3$, $A_5$, $A_7$, . . . of the AD clock.

The linear approximator 50 carries out linear approximation using the formula (1), based on the relation between the values held respectively by the latches 32, 42 and the values of the data held by the latches 12, 22, and updates the output value at the timing when the control signal outputted from the timing generator 60 turns active. In the example of FIG. 1, at the edge $A_{k+1}$ of the AD clock following the arrival of the edge $B_i$ of the external trigger, the value of the data held by the latch 22 is updated to $D_k$ and the value of the data held by the latch 12 is updated to $D_{k+1}$. Also, at the edge $A_{k+1}$ of the AD clock, the value held by the latch 42 is updated to $n_k$ and the value held by the latch 32 is updated to $m_k$. After the edge $A_{k+1}$ of the AD clock, the output value from the linear approximator 50 is updated to the value $DO_i$ obtained by the linear approximation formula (1).

Figure 3:
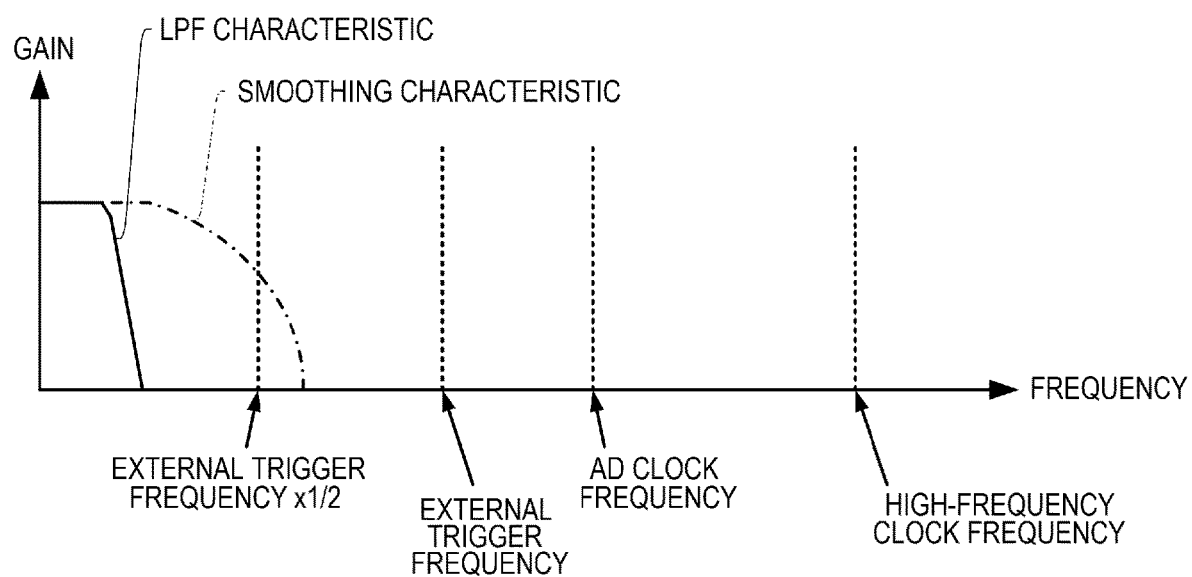
FIG. 3 shows an example of a characteristic of a low-pass filter and a characteristic of averaging.

FIG. 3 shows an example of a characteristic of the low-pass filter 10 and a characteristic of smoothing in which the resampled value is calculated based on the AD data outputted from the low-pass filter 10. In FIG. 3, the horizontal axis represents frequency and the vertical axis represents gain. The characteristic (LPF characteristic) of the low-pass filter 10 is indicated by a solid line. The characteristic of smoothing (smoothing characteristic) is indicated by a chain-dashed line. As shown in FIG. 3, to reduce a folding noise in the frequency band of the smoothed signal in the resampling based on the external trigger, the cutoff frequency of the low-pass filter 10 is set to be lower than half the frequency of the external trigger (Nyquist frequency). The pass range of the low-pass filter 10 limits the frequency band of the measurement data outputted from the resampling circuit 1.

In the related-art technique, for example, in the foregoing IMU or physical quantity sensor, when a clock signal for A/D conversion and an external trigger signal are asynchronous with each other, a periodic noise may be generated in output data due to a periodic resampling error, resulting in lower quality of measurement data.

In contrast, the resampling circuit 1 of the first embodiment having the foregoing configuration according to the present disclosure measures a first time interval, which is the time interval between two successive edges of the AD clock, and a second time interval, which is the time interval between one of the two edges of the AD clock and an edge of the external trigger, with a high-frequency clock having a higher frequency than the AD clock and the external trigger. The resampling circuit 1 of the first embodiment then calculates and outputs measurement data updated at the edge of the external trigger, based on the first time interval and the second time interval thus measured, and the two AD data updated at the two edges of the AD clock. Specifically, the measurement data updated at the edge of the external trigger is calculated by linear approximation based on the relation between the first time interval and the second time interval thus measured, and the two AD data updated at the two edges of the AD clock. Thus, the resampling circuit 1 of the first embodiment, which asynchronously resamples the AD data in response to the external trigger, smoothes the AD data near the edge of the external trigger to generate measurement data and therefore can reduce a periodic noise generated in the resampled measurement data.

Also, in the resampling circuit 1 of the first embodiment, the low-pass filter 10 limits the band of the measurement data. Therefore, the AD data outputted from the low-pass filter 10 has a high correlation around the point when the AD data is updated synchronously with an edge of the AD clock, and the error due to linear approximation is reduced. Thus, measurement data is acquired with high accuracy.

Moreover in the resampling circuit 1 of the first embodiment, the AD clock having a higher frequency than the external trigger can form a filter and therefore the low-pass filter 10 having a high degree of freedom in filter shape limits the band of the measurement data. This reduces the constraint on the design of a band-limiting filter provided on the stage subsequent to the resampling circuit 1 and can reduce the circuit area of the band-limiting filter. Thus, for example, making the pass range of the low-pass filter 10 equal to the pass range of the band-limiting filter to be provided on the stage subsequent to the resampling circuit enables omission of the band-limiting filter.

1-2. Second Embodiment

Figure 4:
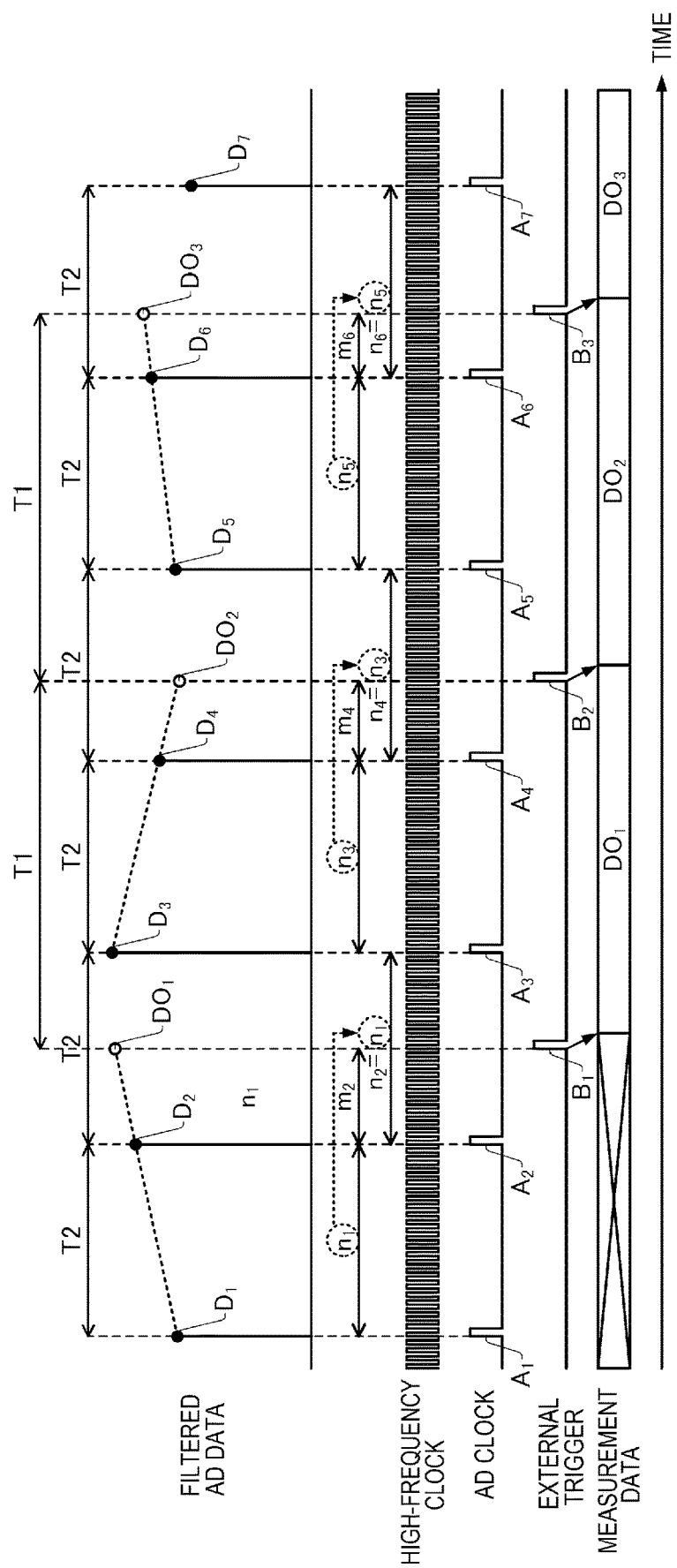
FIG. 4 illustrates an outline of processing in a resampling circuit according to a second embodiment.

FIG. 4 illustrates an outline of processing in a resampling circuit according to a second embodiment. In FIG. 4, an edge of an external clock comes every period T1 and an edge of an AD clock comes every period T2. Of two successive edges $A_1$, $A_2$ of the AD clock, the edge $A_1$ occurs before an edge $B_1$ of the external trigger, and the edge $A_2$ occurs after the edge $A_1$ and before the edge $B_1$. Of two successive edges $A_3$, $A_4$ of the AD clock, the edge $A_3$ occurs before an edge $B_2$ of the external trigger, and the edge $A_4$ occurs after the edge $A_3$ and before the edge $B_2$. Similarly, of two successive edges $A_5$, $A_6$ of the AD clock, the edge $A_5$ occurs before an edge $B_3$ of the external trigger, and the edge $A_6$ occurs after the edge $A_5$ and before the edge $B_3$. The edges $A_1$, $A_3$, $A_5$ are an example of the "first edge" according to the present disclosure. The edges $A_2$, $A_4$, $A_6$ are an example of the "second edge" according to the present disclosure.

The resampling circuit of the second embodiment regards the time interval between two successive edges $A_k$, $A_{k+1}$ of the AD clock with an edge $B_i$ of the external trigger coming in-between, as equal to a first time interval $n_{k-1}$, which is the time interval between two edges $A_{k-1}$, $A_k$ of the AD clock, and calculates a resampled value $DO_i$ at the edge $B_i$ by the following extrapolation-based linear approximation formula (2), based on the relation between the first time interval $n_{k-1}$ and a second time interval $m_k$, which is the time interval between the edge $A_k$ and the edge $B_i$, and two values $D_{k-1}$, $D_k$ of the AD data updated at the two edges $A_{k-1}$, $A_k$.

$$DO_i = D_k + (D_k - D_{k-1}) \times \frac{m_k}{n_{k-1}} \quad (2)$$

The resampling circuit of the second embodiment then outputs measurement data having resampled values $DO_1$, $DO_2$, $DO_3$, . . . every period T1 of the external trigger.

Figure 5:
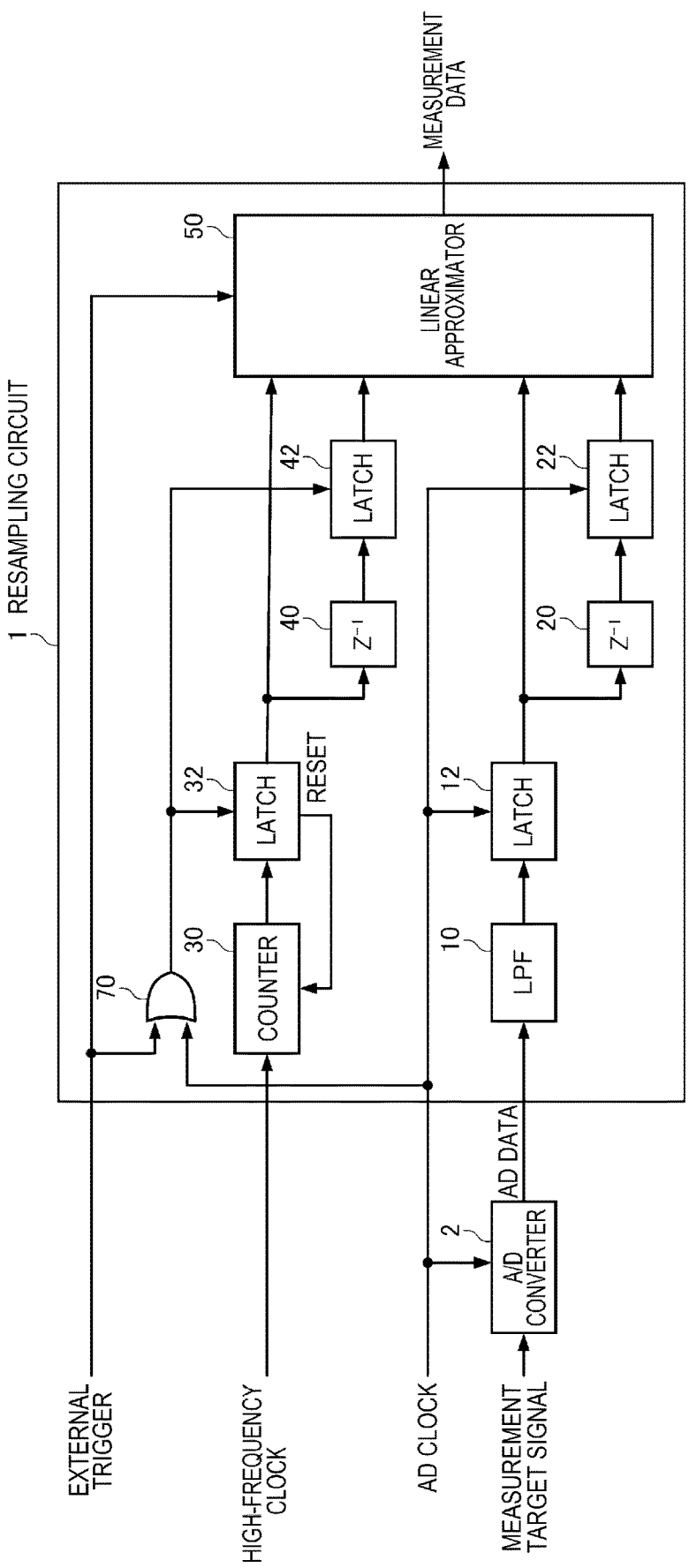
FIG. 5 shows an example of the configuration of the resampling circuit according to the second embodiment.

FIG. 5 shows an example of the configuration of the resampling circuit of the second embodiment. In FIG. 5, components similar to those in FIG. 2 are denoted by the same reference signs. In the description below, the explanation of components similar to those in the first embodiment is omitted or simplified. As shown in FIG. 5, a resampling circuit 1 of the second embodiment includes a low-pass filter 10, a latch 12, a delay ($Z^{-1}$) 20, a latch 22, a counter 30, a latch 32, a delay ($Z^{-1}$) 40, a latch 42, a linear approximator 50, and an OR circuit 70.

The configurations and operations of the low-pass filter 10, the latches 12, 22, 32, 42, the delays 20, 40, the counter 30, and the OR circuit 70 are similar to those in the first embodiment and therefore will not be described further.

The linear approximator 50 carries out linear approximation using the formula (2), based on the relation between the values held respectively by the latches 32, 42 and the values of the data held by the latches 12, 22, and updates the output value after the edge of the external trigger. In the example of FIG. 4, at the edge $B_i$ of the external trigger, the value of the data held by the latch 22 is $D_{k-1}$ and the value of the data held by the latch 12 is $D_k$. Also, at the edge $B_i$ of the external trigger, the value held by the latch 42 is updated to $n_{k-1}$ and the value held by the latch 32 is updated to $m_k$. After the edge $B_i$ of the external trigger, the output value from the linear approximator 50 is updated to the value $DO_i$ obtained by the linear approximation formula (2).

With such a configuration, the resampling circuit 1 of the second embodiment measures a first time interval, which is the time interval between two successive edges of the AD clock, and a second time interval, which is the time interval between one of the two edges of the AD clock and an edge of the external trigger, with a high-frequency clock having a higher frequency than the AD clock and the external trigger. The resampling circuit 1 of the second embodiment then calculates and outputs measurement data updated at the edge of the external trigger, based on the first time interval and the second time interval thus measured, and the two AD data updated at the two edges of the AD clock. Specifically, the measurement data updated at the edge of the external trigger is calculated by linear approximation based on the relation between the first time interval and the second time interval thus measured, and the two AD data updated at the two edges of the AD clock. Thus, the resampling circuit 1 of the second embodiment, which asynchronously resamples the AD data in response to the external trigger, smoothes the AD data near the edge of the external trigger to generate measurement data and therefore can reduce a periodic noise generated in the resampled measurement data.

Also, the resampling circuit 1 of the second embodiment can achieve effects similar to those of the resampling circuit 1 of the first embodiment.

Moreover, in the resampling circuit 1 of the second embodiment, when an edge of the external trigger comes, linear approximation can be carried out without having to wait for the next edge of the AD clock. Therefore, the delay time until the measurement data is outputted after the external trigger is inputted can be made shorter than in the resampling circuit 1 of the first embodiment.

1-3. Third Embodiment

Figure 6:
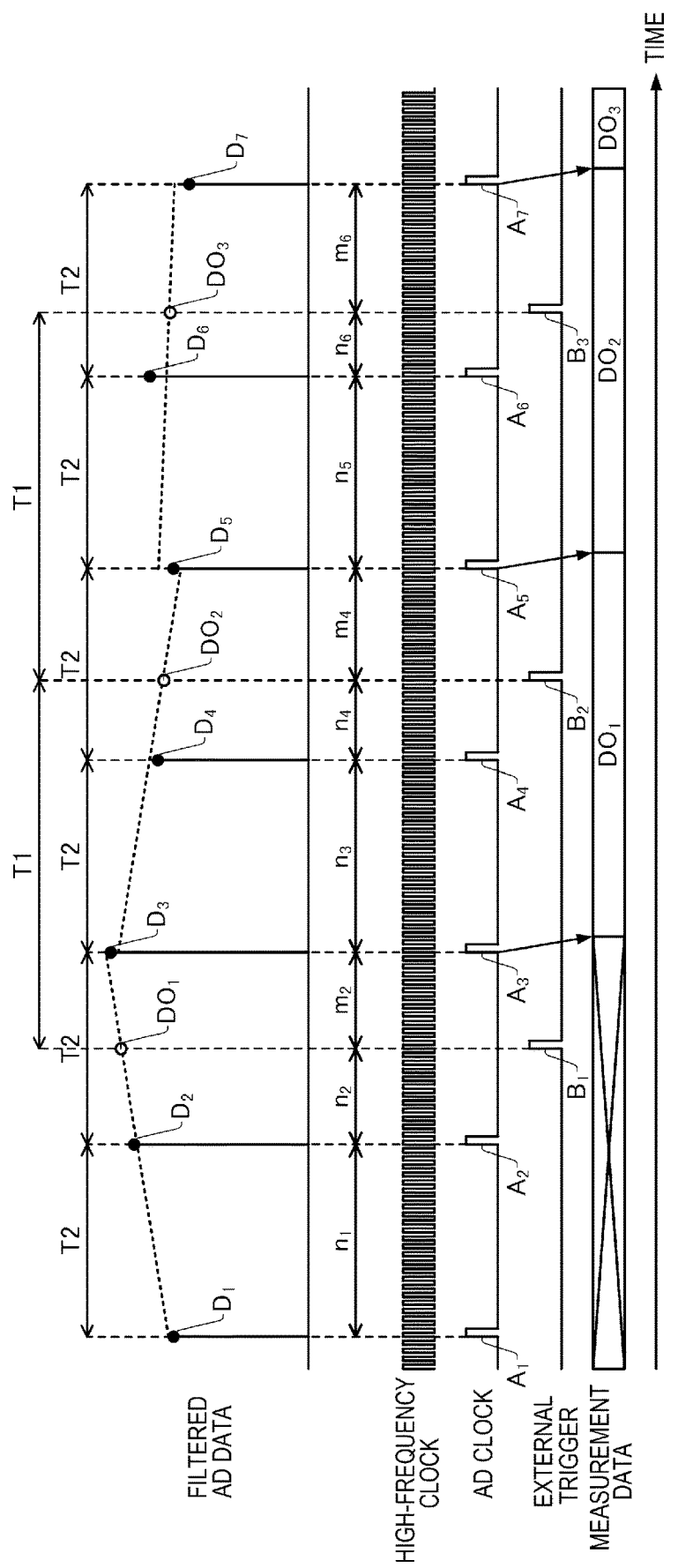
FIG. 6 illustrates an outline of processing in a resampling circuit according to a third embodiment.

FIG. 6 illustrates an outline of processing in a resampling circuit according to a third embodiment. In FIG. 6, an edge of an external clock comes every period T1 and an edge of an AD clock comes every period T2. An edge $B_1$ of the external trigger comes between two edges $A_2$, $A_3$, of three successive edges $A_1$, $A_2$, $A_3$ of the AD clock. The two edges $A_1$, $A_2$ occur before the edge $B_1$. The edge $A_3$ occurs after the edge $B_1$. An edge $B_2$ of the external trigger comes between two edges $A_4$, $A_5$, of three successive edges $A_3$, $A_4$, $A_5$ of the AD clock. The two edges $A_3$, $A_4$ occur before the edge $B_2$. The edge $A_5$ occurs after the edge $B_2$. Similarly, an edge $B_3$ of the external trigger comes between two edges $A_6$, $A_7$, of three successive edges $A_5$, $A_6$, $A_7$ of the AD clock. The two edges $A_5$, $A_6$ occur before the edge $B_3$. The edge $A_7$ occurs after the edge $B_3$. The edges $A_2$, $A_4$, $A_g$ are an example of the "first edge" according to the present disclosure. The edges $A_3$, $A_5$, $A_7$ are an example of the "second edge" according to the present disclosure.

The resampling circuit of the third embodiment calculates a resampled value $DO_i$ at an edge $B_i$ by interpolation-based linear approximation, based on the relation between a first time interval $n_{k-1}$, which is the time interval between two successive edges $A_{k-1}$, $A_k$ of three successive edges $A_{k-1}$, $A_k$, $A_{k+1}$ of the AD clock with an edge $B_i$ of the external trigger coming in-between, a first time interval $n_k+m_k$, which is the time interval between the two edges $A_k$, $A_{k+1}$, a second time interval $n_k$, which is the time interval between the edge $A_k$ and the edge $B_i$, and three values $D_{k-1}$, $D_k$, $D_{k+1}$ of the AD data updated at the three edges $A_{k-1}$, $A_k$, $A_{k+1}$. For example, the least squares method or the like can be used as a method of linear approximation. The resampling circuit of the third embodiment then outputs measurement data having resampled values $DO_1$, $DO_2$, $DO_3$, every period T1 of the external trigger.

Figure 7:
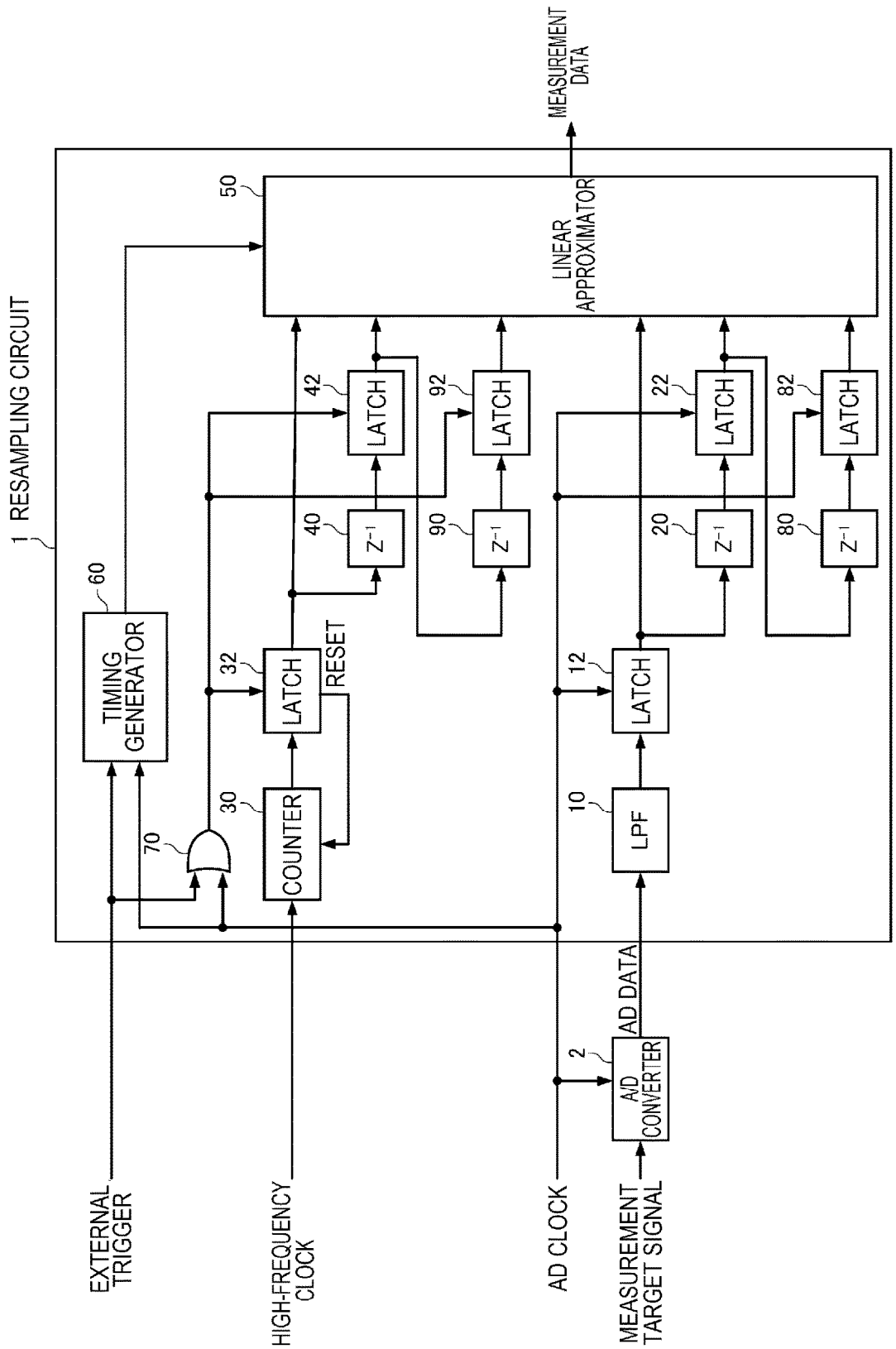
FIG. 7 shows an example of the configuration of the resampling circuit according to the third embodiment.

FIG. 7 shows an example of the configuration of the resampling circuit of the third embodiment. In FIG. 7, components similar to those in FIG. 2 are denoted by the same reference signs. In the description below, the explanation of components similar to those in the first embodiment is omitted or simplified. As shown in FIG. 7, a resampling circuit 1 of the third embodiment includes a low-pass filter 10, a latch 12, a delay ($Z^{-1}$) 20, a latch 22, a counter 30, a latch 32, a delay ($Z^{-1}$) 40, a latch 42, a linear approximator 50, a timing generator 60, an OR circuit 70, a delay ($Z^{-1}$) 80, a latch 82, a delay ($Z^{-1}$) 90, and a latch 92.

The configurations and operations of the low-pass filter 10, the latch 12, the delay 20, the latch 22, the counter 30, the latch 32, the delay 40, the latch 42, and the OR circuit 70 are similar to those in the first embodiment and therefore will not be described further.

The delay 80 delays the data held by the latch 22 and outputs the delayed data. The latch 82 takes in and holds the data outputted from the delay 80 at every edge of the AD clock. The edge of the AD clock at which the latch 82 takes in the data may be the same as the edge of the AD clock at which the latches 12, 22 take in the data. For example, the delay 80 and the latch 82 are implemented by a register made up of a predetermined number of D flip-flops.

The delay 90 delays the value held by the latch 42 and outputs the delayed value. The latch 92 takes in and holds the value outputted from the delay 90, at every edge of the OR signal outputted from the OR circuit 70. For example, the delay 90 and the latch 92 are implemented by a register made up of a predetermined number of D flip-flops.

The linear approximator 50 carries out linear approximation based on the relation between the values held respectively by the latches 32, 42, 92 and the values of the data held by the latches 12, 22, 82 and updates the output value at the timing when the control signal outputted from the timing generator 60 turns active. In the example of FIG. 6, at the edge $A_{k+1}$ of the AD clock following the arrival of the edge $B_i$ of the external trigger, the value of the data held by the latch 82 is updated to $D_{k-1}$, the value of the data held by the latch 22 is updated to $D_k$, and the value of the data held by the latch 12 is updated to $D_{k+1}$. Also, at the edge $A_{k+1}$ of the AD clock, the value held by the latch 92 is updated to $n_{k-1}$, the value held by the latch 42 is updated to $n_k$, and the value held by the latch 32 is updated to $m_k$. After the edge $A_{k+1}$ of the AD clock, the output value from the linear approximator 50 is updated to the value $DO_i$ obtained by linear approximation.

With such a configuration, the resampling circuit 1 of the third embodiment measures two first time intervals, which are the time intervals between three successive edges of the AD clock, and a second time interval, which is the time interval between one of the three edges of the AD clock signal and an edge of the external trigger, with a high-frequency clock having a higher frequency than the AD clock and the external trigger. The resampling circuit 1 of the third embodiment then calculates and outputs measurement data updated at the edge of the external trigger, based on the two first time intervals and the second time interval thus measured, and the three AD data updated at the three edges of the AD clock. Specifically, the measurement data updated at the edge of the external trigger is calculated by linear approximation based on the relation between the two first time intervals and the second time interval thus measured, and the three AD data updated at the three edges of the AD clock. Thus, the resampling circuit 1 of the third embodiment, which asynchronously resamples the AD data in response to the external trigger, smoothes the AD data near the edge of the external trigger to generate measurement data and therefore can reduce a periodic noise generated in the resampled measurement data.

Also, the resampling circuit 1 of the third embodiment can achieve effects similar to those of the resampling circuit 1 of the first embodiment.

1-4. Fourth Embodiment

Figure 8:
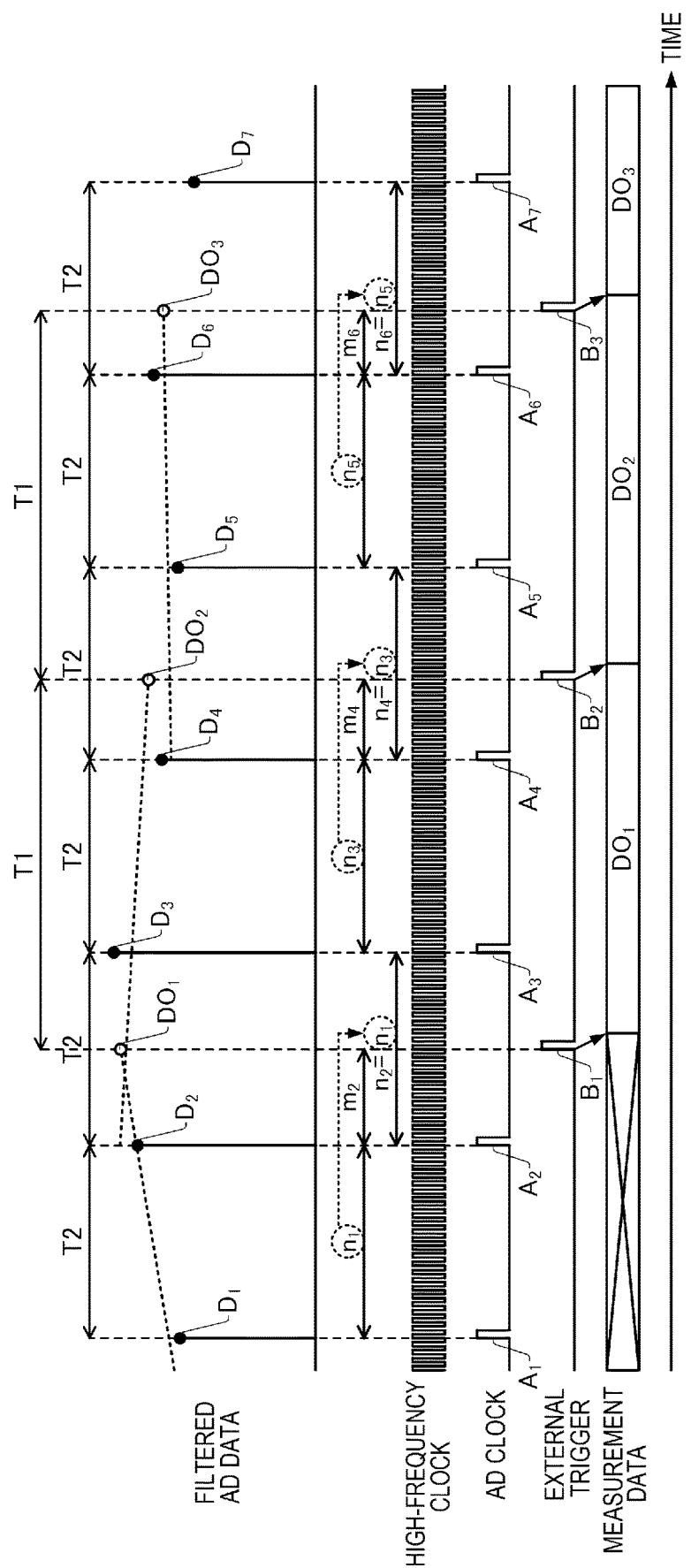
FIG. 8 illustrates an outline of processing in a resampling circuit according to a fourth embodiment.

FIG. 8 illustrates an outline of processing in a resampling circuit according to a fourth embodiment. In FIG. 8, an edge of an external clock comes every period T1 and an edge of an AD clock comes every period T2. Of three successive edges $A_0, A_1, A_2$ (edge $A_0$ not being illustrated) of the AD clock, two edges $A_0, A_1$ occur before an edge $B_1$ of the external trigger, and the edge $A_2$ occurs after the edge $A_1$ and before the edge $B_1$. Of three successive edges $A_2, A_3, A_4$ of the AD clock, two edges $A_2, A_3$ occur before an edge $B_2$ of the external trigger, and the edge $A_4$ occurs after the edge $A_3$ and before the edge $B_2$. Similarly, of three successive edges $A_4, A_5, A_6$ of the AD clock, two edges $A_4, A_5$ occur before an edge $B_3$ of the external trigger, and the edge $A_6$ occurs after the edge $A_5$ and before the edge $B_3$. The edges $A_1, A_3, A_5$ are an example of the "first edge" according to the present disclosure. The edges $A_2, A_4, A_6$ are an example of the "second edge" according to the present disclosure.

The resampling circuit of the fourth embodiment regards the time interval between two successive edges $A_k, A_{k+1}$ of the AD clock with an edge $B_i$ of the external trigger coming in-between, as equal to a first time interval $n_{k-1}$, which is the time interval between two edges $A_{k-1}, A_k$ of the AD clock, and calculates a resampled value $DO_i$ at the edge $B_i$ by extrapolation-based linear approximation, based on the relation between a first time interval $n_{k-2}$, which is the time interval between two edges $A_{k-2}, A_{k-1}$ of the AD clock, the first time interval $n_{k-1}$, a second time interval $m_k$, which is the time interval between the edge $A_k$ and the edge $B_i$, and three values $D_{k-2}, D_{k-1}, D_k$ of the AD data updated at the three edges $A_{k-2}, A_{k-1}, A_k$. For example, the least squares method or the like can be used as a method of linear approximation. The resampling circuit of the fourth embodiment then outputs measurement data having resampled values $DO_1, DO_2, DO_3, \ldots$ every period T1 of the external trigger.

Figure 9:
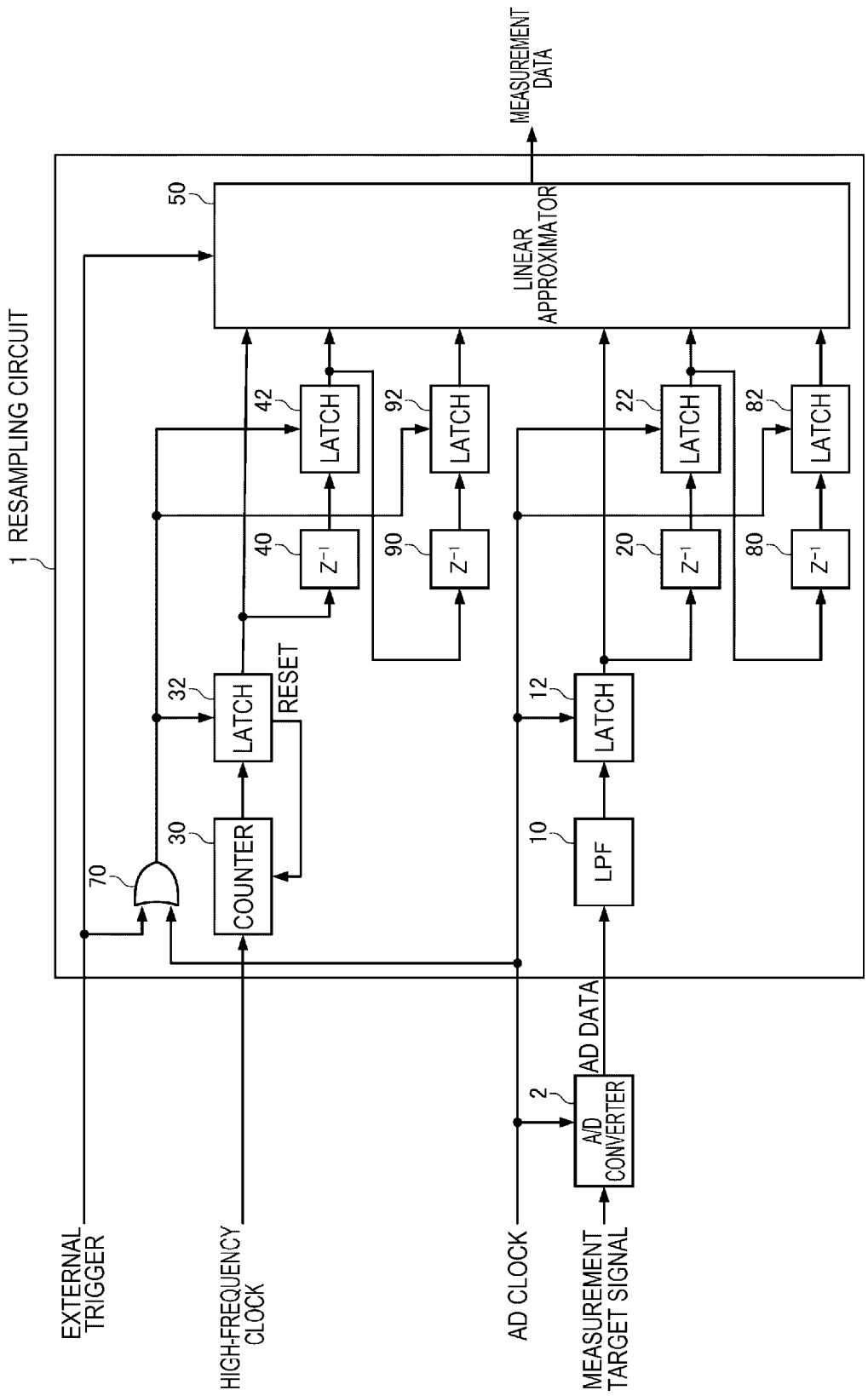
FIG. 9 shows an example of the configuration of the resampling circuit according to the fourth embodiment.

FIG. 9 shows an example of the configuration of the resampling circuit of the fourth embodiment. In FIG. 9, components similar to those in FIG. 7 are denoted by the same reference signs. In the description below, the explanation of components similar to those in the third embodiment is omitted or simplified. As shown in FIG. 9, a resampling circuit 1 of the fourth embodiment includes a low-pass filter 10, a latch 12, a delay ($Z^{-1}$) 20, a latch 22, a counter 30, a latch 32, a delay ($Z^{-1}$) 40, a latch 42, a linear approximator 50, an OR circuit 70, a delay ($Z^{-1}$) 80, a latch 82, a delay ($Z^{-1}$) 90, and a latch 92.

The configurations and operations of the low-pass filter 10, the latches 12, 22, 32, 42, 82, 92, the delays 20, 40, 80, 90, the counter 30, and the OR circuit 70 are similar to those in the third embodiment and therefore will not be described further.

The linear approximator 50 carries out linear approximation based on the relation between the values held respectively by the latches 32, 42, 92 and the values of the data held by the latches 12, 22, 82 and updates the output value after the edge of the external trigger. In the example of FIG. 8, at the edge $B_i$ of the external trigger, the value of the data held by the latch 82 is $D_{k-2}$, the value of the data held by the latch 22 is $D_{k-1}$, and the value of the data held by the latch 12 is $D_k$. Also, at the edge $B_i$ of the external trigger, the value held by the latch 92 is updated to $n_{k-2}$, the value held by the latch 42 is updated to $n_{k-1}$, and the value held by the latch 32 is updated to $m_k$. After the edge $B_i$ of the external trigger, the output value from the linear approximator 50 is updated to the value $DO_i$ obtained by linear approximation.

With such a configuration, the resampling circuit 1 of the fourth embodiment measures two first time intervals, which are the time intervals between three successive edges of the AD clock, and a second time interval, which is the time interval between one of the three edges of the AD clock signal and an edge of the external trigger, with a high-frequency clock having a higher frequency than the AD clock and the external trigger. The resampling circuit 1 of the fourth embodiment then calculates and outputs measurement data updated at the edge of the external trigger, based on the two first time intervals and the second time interval thus measured, and the three AD data updated at the three edges of the AD clock. Specifically, the measurement data updated at the edge of the external trigger is calculated by linear approximation based on the relation between the two first time intervals and the second time interval thus measured, and the three AD data updated at the three edges of the AD clock. Thus, the resampling circuit 1 of the fourth embodiment, which asynchronously resamples the AD data in response to the external trigger, smoothes the AD data near the edge of the external trigger to generate measurement data and therefore can reduce a periodic noise generated in the resampled measurement data.

Also, the resampling circuit 1 of the fourth embodiment can achieve effects similar to those of the resampling circuit 1 of the second embodiment.

2. Physical Quantity Sensor Unit

A physical quantity sensor unit according to this embodiment includes the resampling circuit 1 of the foregoing embodiments and a physical quantity sensor which outputs a measurement target signal. The physical quantity sensor unit outputs packet data including detection data of a physical quantity, synchronously with an external trigger supplied from an arithmetic processing device (host). The physical quantity sensor detects at least one of acceleration and angular velocity as a physical quantity. In the description below, a physical quantity sensor unit 100 having a physical quantity sensor which is an acceleration sensor for detecting acceleration as a physical quantity is described as an example.

Figure 10:
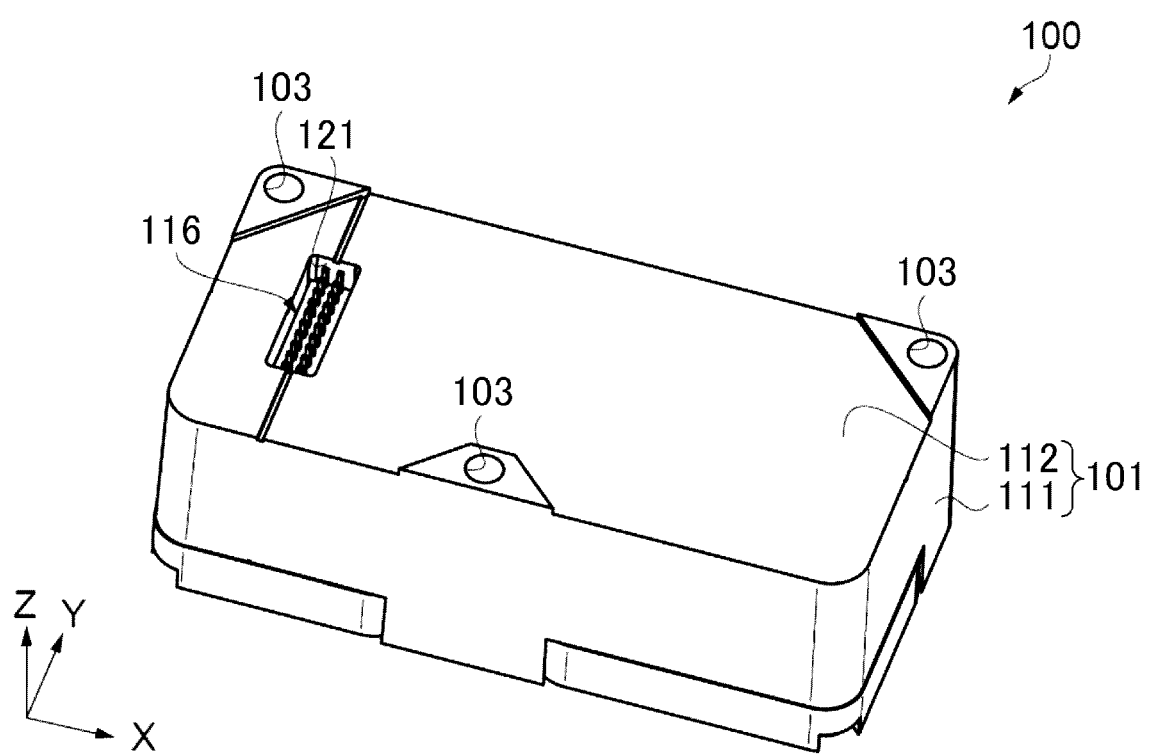
FIG. 10 is a perspective view showing an outline of a physical quantity sensor unit.

FIG. 10 is a perspective view showing the configuration of the physical quantity sensor unit 100 as viewed from an installation target surface where the physical quantity sensor unit 100 is fixed. In the description below, an axis along the long sides of the physical quantity sensor unit 100, which is rectangular as viewed in a plan view, is defined as an X-axis. An axis orthogonal to the X-axis as viewed in a plan view is defined as a Y-axis. An axis along the thickness of the physical quantity sensor unit 100 is defined as a Z-axis.

The physical quantity sensor unit 100 is a rectangular parallelepiped having a rectangular planar shape. The physical quantity sensor unit 100 is, for example, approximately 50 mm long on the long sides along the X-axis, approximately 24 mm long on the short sides along the Y-axis orthogonal to the X-axis, and approximately 16 mm thick. The physical quantity sensor unit 100 has a screw hole 103 formed at two positions near both ends of one long side and at one position in a center part of the other long side. The physical quantity sensor unit 100 is used in the state of being fixed to an installation target surface of an installation target object (device) of a structure such as a bridge or bulletin board, with a fixing screw inserted in each of the three screw holes 103.

As shown in FIG. 10, an opening 121 is provided on a surface of the physical quantity sensor unit 100 as viewed from the installation target surface. A plug-type connector 116 is arranged inside the opening 121. The connector 116 has a plurality of pins arranged in two lines. In each line, a plurality of pins is arrayed along the Y-axis. A socket-type connector, not illustrated, is coupled to the connector 116 from the installation target object. This allows transmission and reception of a drive voltage of the physical quantity sensor unit 100 and an electrical signal such as detection data.

Figure 11:
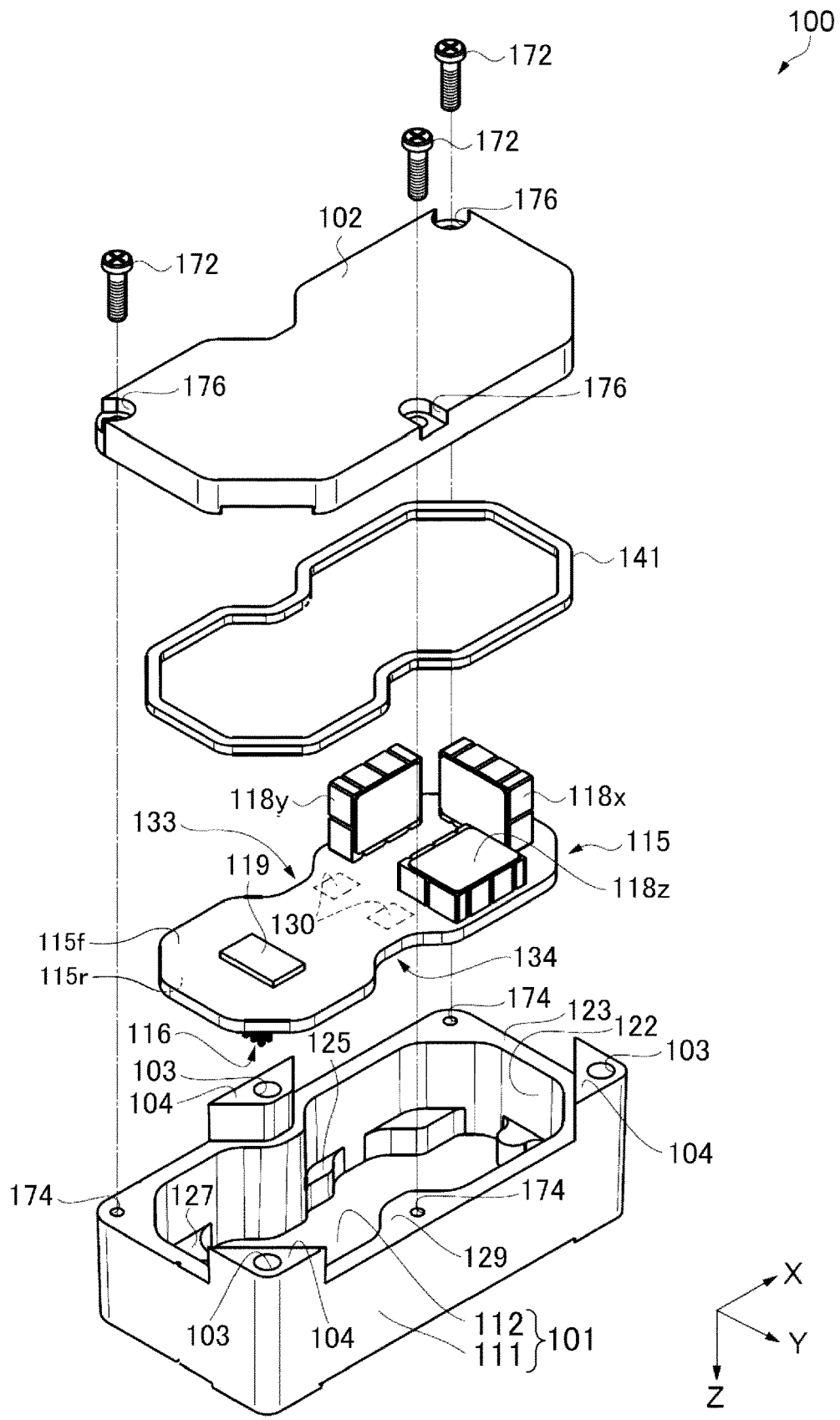
FIG. 11 is an exploded perspective view of the physical quantity sensor unit.

FIG. 11 is an exploded perspective view of the physical quantity sensor unit 100. As shown in FIG. 11, the physical quantity sensor unit 100 is made up of a container 101, a lid 102, a seal member 141, and a circuit board 115 or the like. More specifically, in the physical quantity sensor unit 100, the circuit board 115 is installed inside the container 101 via a fixing member 130, and the opening of the container 101 is covered with the lid 102 via the seal member 141 having a shock absorbing property.

The container 101 is, for example, an accommodation container for the circuit board 115, made of aluminum and molded into the shape of a box having an internal space. The container 101 can be formed by slicing or die-casting (metal mold casting) aluminum. The material of the container 101 is not limited to aluminum and may be other metals such as zinc or stainless steel or may be a resin or a composite material of a metal and a resin. The outer shape of the container 101 is a rectangular parallelepiped having a substantially rectangular planar shape, similarly to the overall shape of the physical quantity sensor unit 100. The container 101 has a fixing protrusion 104 provided at two positions near both ends of one long side and at one position in a center part of the other long side. The screw hole 103 is formed in each of the fixing protrusions 104. The fixing protrusion 104 provided at the two positions near both ends of the one long side is substantially triangular as viewed in a plan view, including an intersection part between the short side and the long side. The fixing protrusion 104 provided at the one position in the center part of the other long side is substantially trapezoidal, facing the internal space of the container 101 as viewed in a plan view.

The container 101 is in the shape of a box having a rectangular-parallelepiped outer shape and opening to one side. The inside of the container 101 is an internal space (accommodation space) surrounded by a bottom wall 112 and a sidewall 111. In other words, the container 101 is in the shape of a box where one face opposite the bottom wall 112 is an opening face 123. The outer edge of the circuit board 115 is arranged (accommodated) along an inner surface 122 of the sidewall 111. The lid 102 is fixed to cover the opening. The opening face 123 opposite the bottom wall 112 is the face where the lid 102 is placed. On the opening face 123, the fixing protrusion 104 is provided upright at the two positions near both ends of the one long side of the container 101 and at the one position in the center part of the other long side. The top surface (surface exposed in the −Z direction) of the fixing protrusion 104 is flush with the top surface of the container 101.

In the internal space of the container 101, a protrusion 129 protruding into the internal space from the sidewall 111 over a range from the bottom wall 112 to the opening face 123 is provided in a center part of the one long side opposite the fixing protrusion 104 provided in the center part of the other long side. A female screw 174 is provided on the top surface (flush with the opening face 123) of the protrusion 129. The lid 102 is fixed to the container 101 via the seal member 141, with a screw 172 inserted in a penetration hole 176 and the female screw 174. The fixing protrusion 104 provided in the center part of the other long side may protrude into the internal space from the sidewall 111 over a range from the bottom wall 112 to the opening face 123, similarly to the protrusion 129. The protrusion 129 and the fixing protrusion 104 are provided at positions facing constricted parts 133, 134 of the circuit board 115, described later.

In the internal space of the container 101, a first pedestal 127 and a second pedestal 125 protruding in the form of a step rising from the bottom wall 112 toward the opening face 123 are provided. The first pedestal 127 is provided at a position facing the arrangement area of the plug-type (male) connector 116 installed on the circuit board 115 and is provided with the opening 121 (see FIG. 10) where the plug-type (male) connector 116 is inserted. The first pedestal 127 functions as a pedestal for fixing the circuit board 115 to the container 101. The opening 121 penetrates the container 101 from the inside (inner side) to the outside.

The second pedestal 125 is located on the other side of the fixing protrusion 104 and the protrusion 129 located in the center parts of the long sides, from the first pedestal 127, and is provided near the fixing protrusion 104 and the protrusion 129. The second pedestal 125 may be coupled to one of the fixing protrusion 104 and the protrusion 129. The second pedestal 125 functions as a pedestal for fixing the circuit board 115 to the container 101, on the other side of the fixing protrusion 104 and the protrusion 129 from the first pedestal 127.

The outer shape of the container 101 is described as the shape of a rectangular-parallelepiped box having a substantially rectangular planar shape and no lid. However, the outer shape of the container 101 is not limited to this. The planar shape of the outer shape of the container 101 may be square, hexagonal, octagonal or the like. In the planar shape of the outer shape of the container 101, the vertices of the polygon may be chamfered and one of the sides may be curved. The planar shape inside the container 101 is not limited to the foregoing shape, either, and may be another shape. The planar shapes of the outer shape and inside of the container 101 may be similar or not similar to each other.

The circuit board 115 is a multilayer board having a plurality of through-holes or the like formed therein and uses a glass epoxy board. However, the circuit board 115 is not limited to a glass epoxy board and may be a rigid board on which a plurality of physical quantity sensors, electronic components, connectors and the like can be installed. For example, a composite board or a ceramic board may be used.

The circuit board 115 has a second surface 115$r$ on the side of the bottom wall 112 and a first surface 115$f$ having a front-back relation with the second surface 115$r$. On the first surface 115$f$ of the circuit board 115, a control IC 119 as a processor and acceleration sensors 118$x$, 118$y$, 118$z$ as physical quantity sensors are installed. On the second surface 115$r$ of the circuit board 115, the connector 116 is installed. Although not illustrated or described, other wirings and terminal electrodes or the like may be provided on the circuit board 115.

The circuit board 115 has the constricted parts 133, 134, which are formed by constricting the outer edge of the circuit board 115, in a center part along the X-axis on the long sides of the container 101, as viewed in a plan view. The constricted parts 133, 134 are provided on both sides along the Y-axis of the circuit board 115, as viewed in a plan view, and are constricted toward the center from the outer edge of the circuit board 115. The constricted parts 133, 134 are provided facing the protrusion 129 and the fixing protrusion 104 of the container 101.

The circuit board 115 is inserted in the internal space of the container 101, with the second surface 115$r$ facing the first pedestal 127 and the second pedestal 125. The circuit board 115 is supported in the container 101 by the first pedestal 127 and the second pedestal 125.

The acceleration sensors 118$x$, 118$y$, 118$z$ detecting acceleration as a physical quantity respectively detect acceleration along one axis. Specifically, the acceleration sensor 118$x$ is provided upright in such a way that the front and back surfaces of its package are placed on the X-axis and that a lateral surface faces the first surface 115$f$ of the circuit board 115. The acceleration sensor 118$x$ detects acceleration applied on the X-axis and outputs a measurement target signal corresponding to the detected acceleration. The acceleration sensor 118$y$ is provided upright in such a way that the front and back surfaces of its package are placed on the Y-axis and that a lateral surface faces the first surface 115$f$ of the circuit board 115. The acceleration sensor 118$y$ detects acceleration applied on the Y-axis and outputs a measurement target signal corresponding to the detected acceleration. The acceleration sensor 118$z$ is provided in such a way that the front and back surfaces of its package are placed on the Z-axis and that the front and back surfaces of the package directly face the first surface 115$f$ of the circuit board 115. The acceleration sensor 118$z$ detects acceleration applied on the Z-axis and outputs a measurement target signal corresponding to the detected acceleration.

The control IC 119 as a processor is electrically coupled to the acceleration sensors 118$x$, 118$y$, 118$z$ via a wiring, not illustrated. The control IC 119 is a MCU (micro controller unit) and includes an A/D converter (equivalent to the A/D converter 2 described in the above embodiments) to which the measurement target signals outputted respectively from the acceleration sensors 118$x$, 118$y$, 118$z$ are inputted, the resampling circuit 1 of one of the above embodiments, a digital processing circuit which performs various kinds of conversion and correction on the measurement data outputted from the resampling circuit 1 and generates detection data, and a storage unit including a non-volatile memory, or the like. The control IC 119 controls each part of the physical quantity sensor unit 100. The control IC 119 also generates detection data synchronized with an external trigger, based on the measurement target signals outputted respectively from the acceleration sensors 118$x$, 118$y$, 118$z$, and generates packet data including the detection data. In the storage unit, a program prescribing the order and content of detecting acceleration, a program for including the detection data into the packet data, and accompanying data or the like are stored. Although not illustrated, a plurality of other electronic components or the like may be installed on the circuit board 115.

An example of the configuration of the acceleration sensors 118$x$, 118$y$, 118$z$ will now be described with reference to FIGS. 12 and 13.

Figure 12:
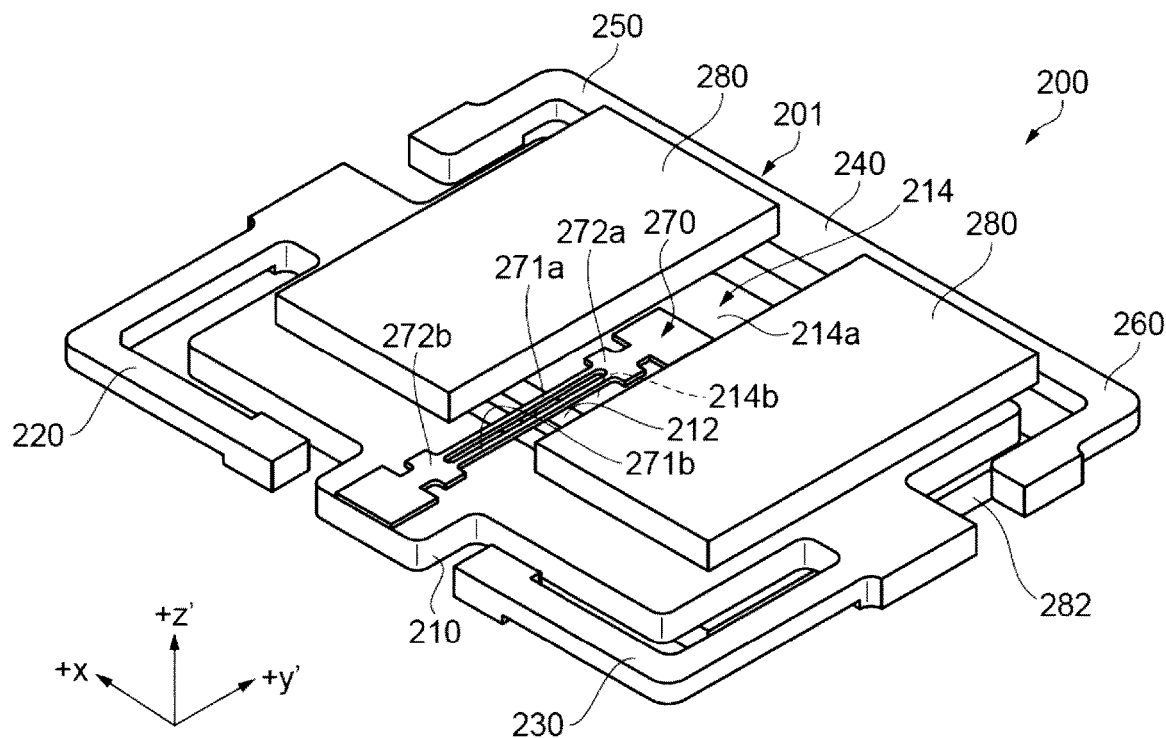
FIG. 12 is a perspective view illustrating a schematic configuration of an acceleration sensor element.

FIG. 12 is a perspective view for explaining a schematic configuration of a sensor element for detecting acceleration. FIG. 13 is a cross-sectional view for explaining an acceleration detector using a sensor element for detecting acceleration.

In FIG. 12, an x-axis, a y'-axis, and a z'-axis are shown as three axes orthogonal to each other. An example of using a so-called quartz crystal z plate (z' plate) sliced out along a plane prescribed by the x-axis and the y'-axis and processed into the shape of a flat plate and having predetermined thickness t on the z'-axis orthogonal to this plane, as a base material, will be described, where the z'-axis is formed by tilting a z-axis by an angle of rotation ϕ (preferably −5°≤ϕ≤15°) so that a +z side rotates into a −y direction on a y-axis and where the y'-axis is formed by tilting the y-axis by the angle of rotation ϕ so that a +y side rotates into a +z direction on the z-axis, in an orthogonal coordinate system having the x-axis as an electrical axis, the y-axis as a mechanical axis, and the z-axis as an optical axis of quartz crystal which is a piezoelectric material used as a base material of an acceleration sensor. The z'-axis is an axis along a direction in which gravity acts in the acceleration sensors 118$x$, 118$y$, 118$z$.

First, the configuration of a sensor element 200 detecting acceleration will be described with reference to FIG. 12. The sensor element 200 has a substrate structure 201 including a base 210 or the like, an acceleration detection element 270 coupled to the substrate structure 201 and detecting a physical quantity, and mass elements 280, 282.

The substrate structure 201 of the sensor element 200 has the base 210, a moving element 214 coupled to the base 210 via a joint 212, a coupler 240, and a first support 220, a second support 230, a third support 250, and a fourth support 260 which are coupled to the base 210. The third support 250 and the fourth support 260 are coupled together on the side where the coupler 240 is arranged.

The substrate structure 201 uses a quartz crystal substrate made up of a quartz crystal z plate (z' plate) sliced out at a predetermined angle, as described above, from a quartz crystal ore as a piezoelectric material. The quartz crystal substrate is patterned to integrally form the components as the substrate structure 201. The patterning can use, for example, photolithography or wet etching.

The base 210 is coupled to the moving element 214 via the joint 212 and supports the moving element 214. The base 210 is coupled to the moving element 214 via the joint 212, to the coupler 240 located on the side opposite to the side where the joint 212 of the moving element is located, to the first support 220 and the second support 230, and to the third support 250 and the fourth support 260 coupled together on the side of the coupler 240.

The joint 212 is provided between the base 210 and the moving element 214 and is coupled to the base 210 and the moving element 214. The thickness (length along the z'-axis) of the joint 212 is thinner (shorter) than the thickness of the base 210 and the thickness of the moving element 214. The joint 212 is constricted as viewed in a cross-sectional view from the x-axis. The joint 212 is formed, for example, as a thin part with a thin thickness by so-called half-etching of the substrate structure 201 including the joint 212. The joint 212 has the function of an axis of rotation along the x-axis as a fulcrum (intermediate hinge) when the moving element 214 is displaced (pivots) about the base 210.

The moving element 214 is coupled to the base 210 via the joint 212. The moving element 214 is in the shape of a plate and has main surfaces 214a, 214b having a front-back relation with each other along the z'-axis. The moving element 214 is displaced along the axis (z'-axis) intersecting the main surfaces 214a, 214b about the joint 212 as the fulcrum (axis of rotation) in response to acceleration as a physical quantity applied on the axis (z'-axis) intersecting the main surfaces 214a, 214b.

The coupler 240 extends in such a way as to surround the moving element 214 along the x-axis from the base 210 on the +x side, where the third support 250, described later, is provided. The coupler 240 is coupled to the base 210 on the −x side, where the fourth support 260, described later, is provided.

The first support 220 and the second support 230 are provided, forming symmetry about the acceleration detection element 270. The third support 250 and the fourth support 260 are provided, forming symmetry about the acceleration detection element 270. At the first support 220, the second support 230, the third support 250, and the fourth support 260, the substrate structure 201 is supported to a fixing target element.

The acceleration detection element 270 is coupled to the base 210 and the moving element 214. In other words, the acceleration detection element 270 is provided extending over the base 210 and the moving element 214. The acceleration detection element 270 has vibrating beams 271a, 271b as vibrators, and a first base 272a and a second base 272b. In the acceleration detection element 270 having the first base 272a and the second base 272b coupled to the base 210, for example, as the moving element 214 is displaced in response to a physical quantity, a stress is generated in the vibrating beams 271a, 271b and physical quantity detection information generated in the vibrating beams 271a, 271b changes. In other words, the vibration frequency (resonance frequency) of the vibrating beams 271a, 271b changes. The acceleration detection element 270 in this embodiment is a dual tuning fork element (dual tuning fork-type vibration element) having the two vibrating beams 271a, 271b, the first base 272a, and the second base 272b. The vibrating beams 271a, 271b as vibrators may also be referred to as vibrating arms, vibrating beams, or columnar beams or the like.

For the acceleration detection element 270, a quartz crystal substrate made of a quartz crystal z plate (z' plate) sliced out at a predetermined angle from a quartz crystal ore or the like as a piezoelectric material, similarly to the foregoing substrate structure 201, is used. The acceleration detection element 270 is formed of the quartz crystal substrate patterned by photolithography or etching. Thus, the vibrating beams 271a, 271b, the first base 272a, and the second base 272b can be integrally formed.

The material of the acceleration detection element 270 is not limited to the quartz crystal substrate. As the material of the acceleration detection element 270, for example, a piezoelectric material such as lithium tantalate ($LiTaO_3$), lithium tetraborate ($Li_2B_4O_7$), lithium niobate ($LiNbO_3$), lead zirconate titanate (PZT), zinc oxide (ZnO), or aluminum nitride (AlN), or a semiconductor material such as silicon having a piezoelectric (piezoelectric material) coating such as zinc oxide (ZnO) or aluminum nitride (AlN) can be used. In this case, the same material may be preferably used for the substrate structure 201 and the acceleration detection element 270.

Although not illustrated or described, the acceleration detection element 270 may be provided with an extraction electrode or an excitation electrode.

The mass elements 280, 282 are provided on the main surface 214a of the moving element 214 and on the main surface 214b, which is the back face in the front-back relation with the main surface 214a. More specifically, the mass elements 280, 282 are provided over the main surfaces 214a, 214b via a mass joining member (not illustrated). The material of the mass elements 280, 282 can be, for example, a metal such as copper (Cu) or gold (Au).

In this embodiment, the vibrator of the acceleration detection element 270 is formed of a dual tuning fork vibrator (dual tuning fork-type vibration element) made up of the two columnar beams of the vibrating beams 271a, 271b. However, the vibrator can be made up of one columnar beam (single beam).

Next, the configuration of an acceleration detector 300 using the foregoing sensor element 200 for detecting acceleration will be described with reference to FIG. 13.

Figure 13:
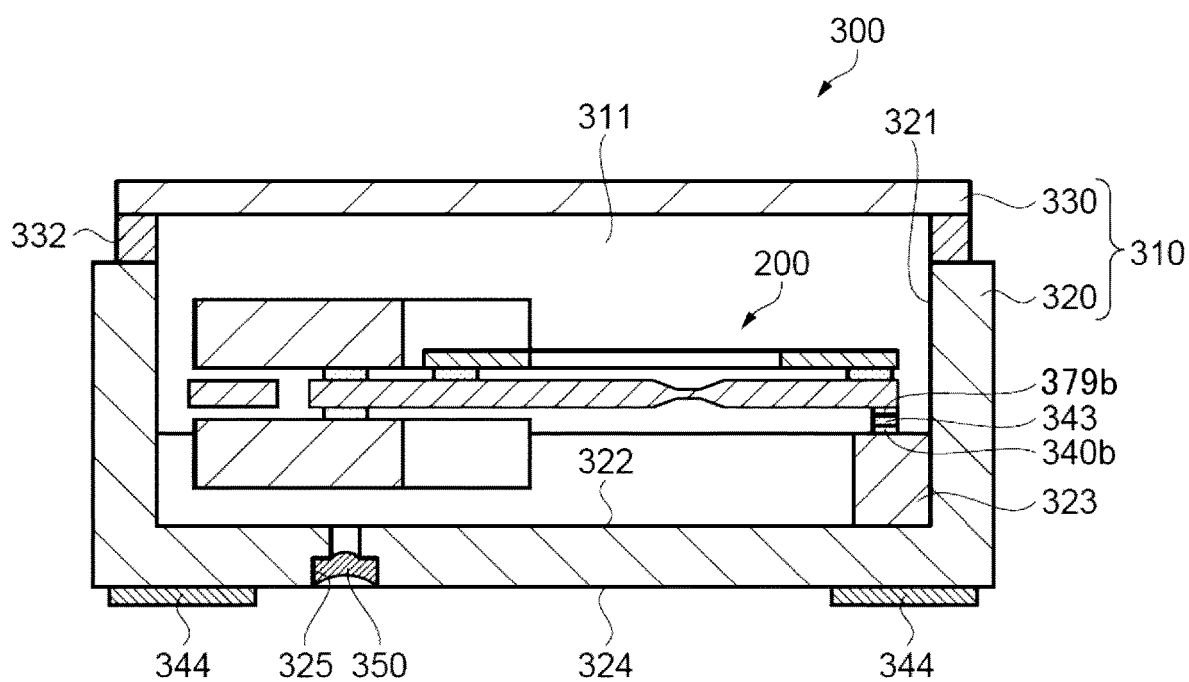
FIG. 13 is a cross-sectional view illustrating a schematic configuration of an acceleration detector using the acceleration sensor element.

As shown in FIG. 13, the foregoing sensor element 200 is installed in the acceleration detector 300. The acceleration detector 300 has the sensor element 200 and a package 310. The package 310 has a package base 320 and a lid 330. The sensor element 200 is accommodated in the package 310 of the acceleration detector 300. Specifically, the sensor element 200 is accommodated in a space 311 provided by the package base 320 and the lid 330 coupled to each other.

The package base 320 has a recess 321. The sensor element 200 is provided inside the recess 321. The shape of the package base 320 is not particularly limited, provided that the sensor element 200 can be accommodated inside the recess 321. The package base 320 in this embodiment can use a material such as ceramic, quartz crystal, glass or silicon.

The package base 320 has a step 323 protruding toward the lid 330 from an inner bottom surface 322, which is a bottom surface on the inner side of the recess of the package base 320. The step 323 is provided, for example, along the inner wall of the recess 321. A plurality of internal terminals 340*b* is provided on the step 323.

The internal terminal 340*b* is provided facing a position that overlaps a fixed part coupling terminal 379*b* provided at a fixed part of each of the first support 220, the second support 230, the third support 250, and the fourth support 260 of the sensor element 200, as viewed in a plan view. The internal terminal 340*b* is electrically coupled to the fixed part coupling terminal 379*b*, for example, using a silicone resin-based conductive adhesive 343 containing a conductive material such as a metal filler. The sensor element 200 is thus loaded in the package base 320 and accommodated inside the package 310.

In the package base 320, an external terminal 344 used to load the package on an external member is provided on an outer bottom surface 324, which is a surface opposite to the inner bottom surface 322. The external terminal 344 is electrically coupled to the internal terminal 340*b* via an internal wiring, not illustrated.

The internal terminal 340*b* and the external terminal 344 are made up of, for example, a multilayer metal film including a metalized layer of tungsten (W) or the like coated with nickel (Ni), gold (Au) or the like by plating or the like.

In the package base 320, a seal 350 sealing the inside of the package 310 is provided at a bottom part of the recess 321. The seal 350 is provided inside a penetration hole 325 formed in the package base 320. The penetration hole 325 penetrates the package base 320 from the outer bottom surface 324 to the inner bottom surface 322. In the example shown in FIG. 13, the penetration hole 325 has a stepped shape with the hole diameter on the side of the outer bottom surface 324 being larger than the hole diameter on the side of the inner bottom surface 322. The seal 350 is formed, for example, by arranging a sealant made up of an alloy of gold (Au) and germanium (Ge), or a solder or the like in the penetration hole 325, and heating and melting and then solidifying the sealant. The seal 350 is provided to airtightly seal the inside of the package 310.

The lid 330 is provided covering the recess 321 of the package base 320. The lid 330 is, for example, in the shape of a plate. For the lid 330, for example, the same material as the package base 320, an alloy of iron (Fe) and nickel (Ni), or a metal such as stainless steel can be used. The lid 330 is joined to the package base 320 via a lid joining member 332. As the lid joining member 332, for example, a seam ring, low-melting glass, inorganic adhesive or the like can be used.

After the lid 330 is joined to the package base 320, the sealant is arranged in the penetration hole 325 in the state where the pressure inside the package 310 is reduced (the degree of vacuum is high), and the sealant is heated and melted and subsequently solidified to provide the seal 350. Thus, the inside of the package 310 can be sealed airtightly. The inside of the package 310 may be filled with an inert gas such as nitrogen, helium, or argon.

In the acceleration detector 300, when a drive signal is provided to the excitation electrode of the sensor element 200 via the external terminal 344, the internal terminal 340*b*, the fixed part coupling terminal 379*b* or the like, the vibrating beams 271*a*, 271*b* of the sensor element 200 vibrate at a predetermined frequency. The acceleration detector 300 outputs the resonance frequency of the sensor element 200 changing according to the applied acceleration, as an output signal. The acceleration detector 300 can be used as the acceleration sensors 118*x*, 118*y*, 118*z* of the physical quantity sensor unit 100. The acceleration sensors 118*x*, 118*y*, 118*z* respectively output a measurement target signal with a frequency corresponding to the applied acceleration.

The physical quantity sensor unit 100 of the embodiment described above includes the resampling circuit 1 configured to reduce a periodic noise generated in resampled measurement data, and therefore can detect a physical quantity with high accuracy.

Up to this point, the physical quantity sensor unit 100 having the acceleration sensors 118*x*, 118*y*, 118*z* as physical quantity sensors is described as an example. However, a physical quantity sensor unit having a physical quantity sensor which detects at least one of mass, angular velocity, angular acceleration, electrostatic capacitance, and temperature as a physical quantity may be employed.

For a mass sensor which detects mass as a physical quantity, a quartz crystal vibrator microbalance method (QCM or quartz crystal microbalance) is known as a technique for measuring a very small mass change. Such a mass sensor utilizes the fact that the oscillation frequency of the quartz crystal vibrator decreases when the mass of matter adhering to the electrode surface of the quartz crystal vibrator increases, whereas the oscillation frequency increases when the mass of the adhering matter decreases. The detection sensitivity of the mass sensor as described above can be calculated by the Sauerbrey equation. For example, for an AT-cut quartz crystal vibrator with a fundamental frequency of 27 MHz, a decrease in frequency of 1 Hz corresponds to an increase in mass of 0.62 ng/cm$^2$ on the electrode surface.

An angular velocity sensor which detects angular velocity or angular acceleration as a physical quantity detects angular velocity, utilizing the fact that an object rotating at a constant angular velocity $\omega$ appears to be rotating at an angular velocity of "$\omega$-$\Omega$" when the object is observed from an observation point rotating at an angular velocity $\Omega$. Such an angular velocity sensor utilizes the fact that when a sensor element receives an angular velocity in the state where a disc-shaped mass is electrostatically driven using an electrode and thus causes a wave having a natural frequency to circle, the apparent resonance frequency observed from the electrode changes. The angular velocity sensor as described above has no theoretical limitation on the bandwidth. Therefore, for example, higher accuracy of a technique for frequency measurement or a technique for nonlinear correction directly leads to higher detection sensitivity.

An electrostatic capacitance sensor which detects electrostatic capacitance as a physical quantity causes RC oscillation using a reference resistance and a measurement target electrostatic capacitance and measures the oscillation frequency, and thus can measure the measurement target electrostatic capacitance. The electrostatic capacitance sensor utilizes the fact that when the measurement target electrostatic capacitance changes, a time constant provided by the RC changes and hence the oscillation frequency shifts. Also, the electrostatic capacitance sensor may be provided with a reference electrostatic capacitance separate from the measurement target electrostatic capacitance and thus may have a mechanism which causes RC oscillation using the reference resistance and the reference electrostatic capacitance, defines its frequency as a reference oscillation frequency, and detects the difference between the foregoing oscillation frequency and the reference oscillation frequency. This can eliminate various error factors.

A temperature sensor which detects temperature as a physical quantity causes RC oscillation using a thermistor and a reference electrostatic capacitance and measures the oscillation frequency, and thus can measure temperature. The temperature sensor utilizes the fact that when the resistance value of the thermistor changes due to temperatures, a time constant provided by the RC changes and hence the oscillation frequency shifts. Also, the temperature sensor may be provided with a reference resistor separate from the thermistor and thus may have a mechanism which causes RC oscillation using the reference resistance and the reference electrostatic capacitance, defines its frequency as a reference oscillation frequency, and detects the difference between the foregoing oscillation frequency and the reference oscillation frequency. This can eliminate various error factors.

The physical quantity sensor unit 100 having the physical quantity sensors for detecting various physical quantities as described above includes the resampling circuit 1 configured to reduce a periodic noise generated in resampled measurement data and therefore can detect a physical quantity with high accuracy.

3. Inertial Measurement Unit (IMU)

An inertial measurement unit according to this embodiment includes a physical quantity sensor which detects at least one of acceleration and angular velocity and which outputs a measurement target signal, a signal processing circuit which includes the resampling circuit 1 according to the foregoing embodiments and which processes a signal outputted from the physical quantity sensor, and a communication circuit which transmits inertial data resulting from the processing by the signal processing circuit, to outside. The inertial measurement unit transmits the inertial data synchronously with an external trigger supplied from an arithmetic processing device (host).

Figure 14:
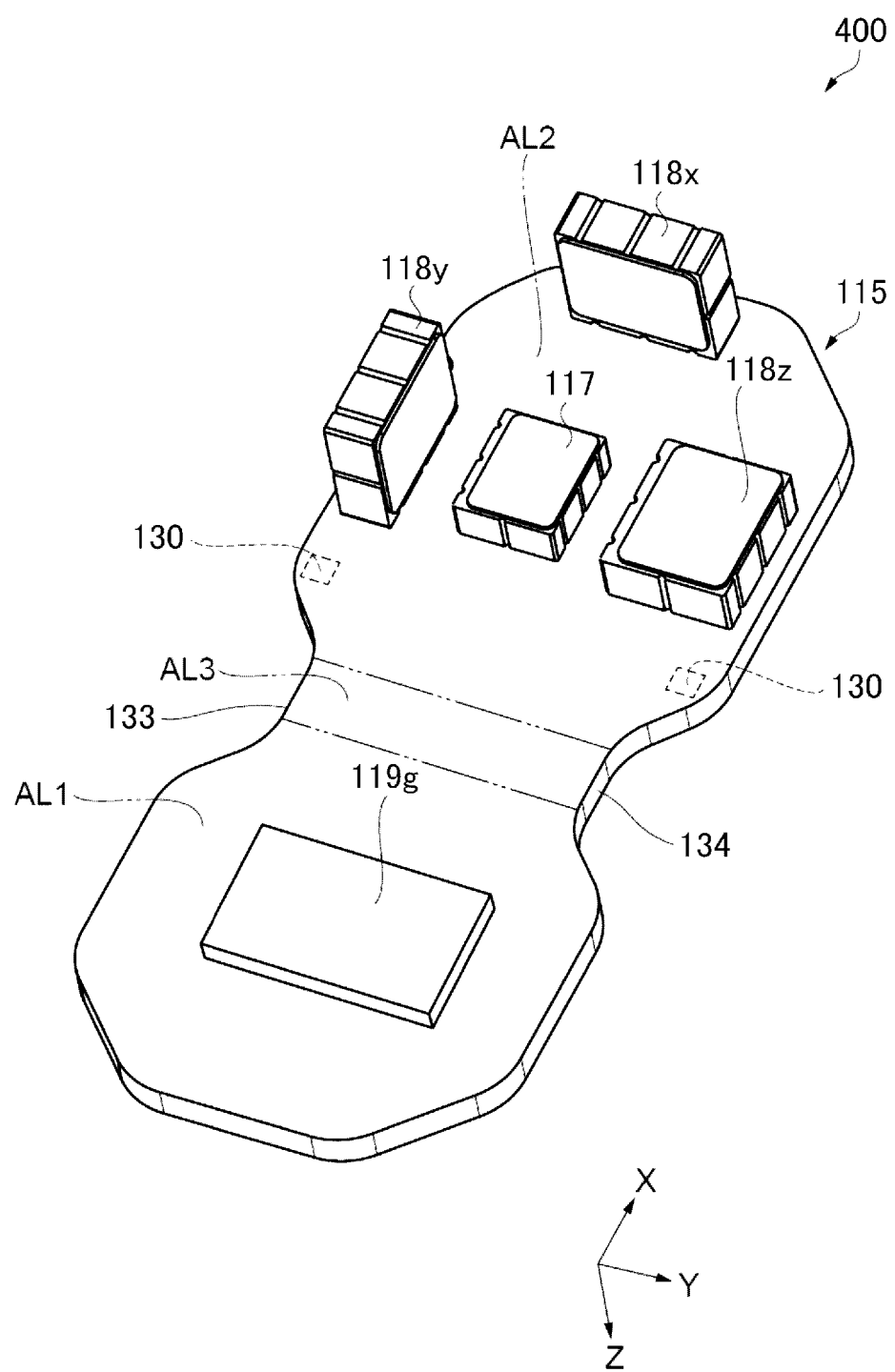
FIG. 14 is a perspective exterior view showing the configuration of a circuit board of an inertial measurement unit according to an embodiment.

The inertial measurement unit of this embodiment may have, for example, a structure similar to the physical quantity sensor unit 100 except that the components installed on the circuit board 115 are different. FIG. 14 is a perspective exterior view showing the configuration of a circuit board of an inertial measurement unit 400 of this embodiment. In FIG. 14, components similar to those in FIG. 11 are denoted by the same reference signs and will not be described repeatedly.

As shown in FIG. 14, the circuit board 115 provided in the inertial measurement unit 400 of this embodiment is divided into a first area AL1, a second area AL2, and a coupling area AL3 located between the first area AL1 and the second area AL2. On a first surface of the second area AL2 of the circuit board 115, three acceleration sensors 118x, 118y, 118z configured to detect acceleration on one axis each and an angular velocity sensor 117 configured to detect angular velocity on three axes are installed. The angular velocity sensor 117, as a single device, can detect angular velocity on an X-axis, a Y-axis, and a Z-axis, that is, on three axes. The angular velocity sensor 117 may use, for example, a vibration gyro sensor made up of a silicon substrate processed by a MEMS technique so as to detect angular velocity, based on a Coriolis force applied to a vibrating object. Also, a control IC 119g is installed on a first surface of the first area AL1 of the circuit board 115, and a plug-type (male) connector (not illustrated) is installed on a second surface having a front-back relation with the first surface of the first area AL1 of the circuit board 115.

The control IC 119g as a processor is electrically coupled to the acceleration sensors 118x, 118y, 118z and the angular velocity sensor 117 via a wiring, not illustrated. The control IC 119g is a MCU and includes a signal processing circuit which processes an acceleration signal outputted from the acceleration sensors 118x, 118y, 118z and an angular velocity signal outputted from the angular velocity sensor 117, a communication circuit which transmits inertial data resulting from the processing by the signal processing circuit, to outside, and a storage unit including a non-volatile memory, or the like. The signal processing circuit includes an A/D converter (equivalent to the A/D converter 2 described in the foregoing embodiments) to which an acceleration signal or an angular velocity signal as a measurement target signal is inputted, the resampling circuit 1 of one of the foregoing embodiments, and a digital processing circuit which performs various kinds of conversion and correction on measurement data outputted from the resampling circuit 1 and generates inertial data, or the like. The control IC 119g controls each part of the physical quantity sensor unit 100, generates inertial data synchronized with an external trigger, based on the acceleration signals outputted respectively from the acceleration sensors 118x, 118y, 118z and the angular velocity signal outputted from the angular velocity sensor 117, and generates packet data including the inertial data. In the storage unit, a program prescribing the order and content of detecting acceleration or angular velocity, a program for including the inertial data into the packet data, and accompanying data or the like are stored. Although not illustrated, a plurality of other electronic components or the like may be installed on the circuit board 115.

With such a configuration, the inertial measurement unit 400 can detect, for example, an attitude and behavior (amount of inertial motion) of a vehicle (installation target device) such as an automobile, agricultural machine (farm machine), construction machine (building machine), robot, and drone. The inertial measurement unit 400 functions as a so-called six-axis motion sensor having the acceleration sensors 118x, 118y, 118z for three axes and the angular velocity sensor 117 for three axes.

The inertial measurement unit 400 of this embodiment described above includes the resampling circuit 1 configured to reduce a periodic noise generated in resampled measurement data and therefore can generate inertial data with high accuracy.

Although the inertial measurement unit 400 is described above as having an acceleration sensor and an angular velocity sensor, the inertial measurement unit 400 may have an angular velocity sensor without having an acceleration sensor, or may have an acceleration sensor without having an angular velocity sensor.

4. Structure Monitoring Device (SHM or Structure Health Monitoring)

Figure 15:
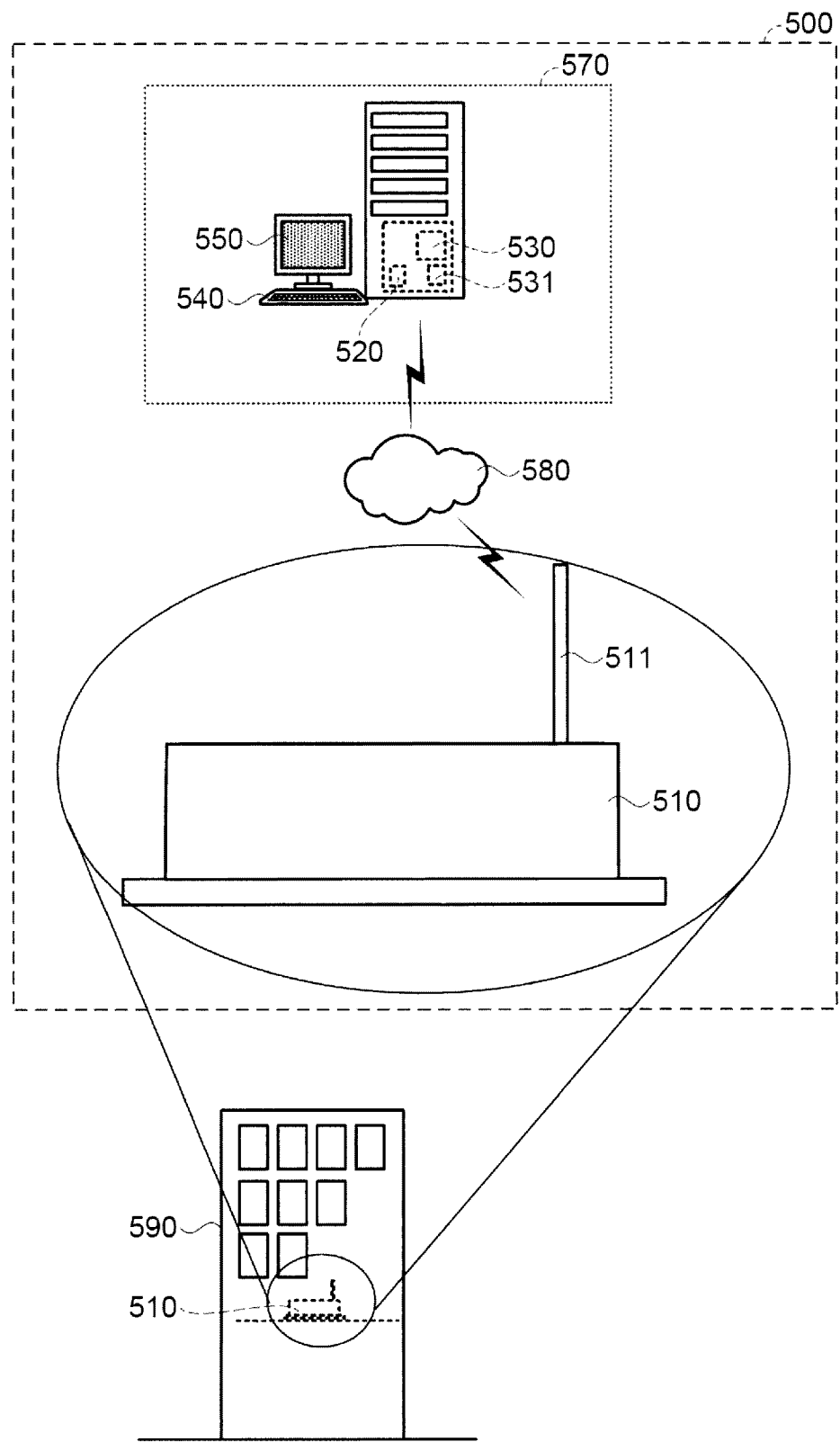
FIG. 15 shows the configuration of a structure monitoring device according to an embodiment.

FIG. 15 shows the configuration of a structure monitoring device according to this embodiment. As shown in FIG. 15, a structure monitoring device 500 according to this embodiment has a physical quantity sensor unit 510 which has the same functions as the physical quantity sensor unit 100 of the foregoing embodiments and which is installed in a structure 590 as a monitoring target. The physical quantity sensor unit 510 includes a transmitter 511 which transmits a detection signal. The transmitter 511 may be implemented as a communication module and antenna separate from the physical quantity sensor unit 510.

The physical quantity sensor unit 510 is coupled, for example, to a monitoring computer 570 via a wireless or wired communication network 580. The monitoring computer 570 has a receiver 520 coupled to the physical quantity sensor unit 510 via the communication network 580, and a calculator 530 which calculates an angle of inclination of the structure 590, based on a received signal outputted from the receiver 520.

The calculator 530 in this embodiment is implemented by an ASIC (application-specific integrated circuit) or FPGA (field-programmable gate array) or the like installed in a monitoring computer 570. However, the calculator 530 may be a processor such as a CPU (central processing unit), and the processor may arithmetically process a program stored in an IC memory 531, thus implementing a software-based configuration. The monitoring computer 570 can accept various operation inputs made by an operator via a keyboard 540 and display the result of arithmetic processing on a touch panel 550.

The structure monitoring device 500 of this embodiment monitors the inclination of the structure 590, using the physical quantity sensor unit 510 having the same functions as the physical quantity sensor unit 100 of the foregoing embodiments. Therefore, the structure monitoring device 500 can utilize the highly accurate detection of a physical quantity (acceleration, angular velocity or the like), which is an advantageous effect of the physical quantity sensor unit 100. Thus, the structure monitoring device 500 can accurately detect the inclination of the structure 590 as a monitoring target and can improve the monitoring quality for the structure 590.

The application of the present disclosure is not limited to the embodiments. Various changes can be made without departing from the scope and spirit of the present disclosure.

For example, while the resampling circuit 1 in the embodiments calculates the measurement data by linear approximation based on the relation between the first time interval and the second time interval, and a plurality of AD data, the resampling circuit 1 may calculate the measurement data by approximation other than linear approximation, such as by curve approximation.

Also, for example, while the resampling circuit 1 of the first embodiment or the second embodiment carries out approximation based on two AD data updated at two successive edges of the AD clock and the resampling circuit 1 of the third embodiment or the fourth embodiment carries out approximation based on three AD data updated at three successive edges of the AD clock, the resampling circuit 1 may carry out approximation based on four or more AD data updated at four or more successive edges of the AD clock.

The foregoing embodiments and modifications are simply examples and are not limiting. For example, the embodiments and modifications can be suitably combined together.

The present disclosure includes a configuration substantially similar to any of the configurations described in the embodiments (for example, a configuration having the same function, method, and result, or a configuration having the same object and effect). The present disclosure also includes a configuration replacing a non-essential element of any of the configurations described in the embodiments. The present disclosure also includes a configuration having the same advantageous effect or achieving the same object as any of the configurations described in the embodiments. The present disclosure also includes a configuration including the related-art technique added to any of the configurations described in the embodiments.

What is claimed is:

1. A resampling circuit converting first data updated synchronously with a first clock signal into second data updated synchronously with a second clock signal asynchronous with the first clock signal and outputting the second data, the resampling circuit measuring a first time interval, which is a time interval between a plurality of successive edges of the first clock signal, and a second time interval, which is a time interval between one of the plurality of edges of the first clock signal and an edge of the second clock signal, with a third clock signal having a higher frequency than the first clock signal and the second clock signal, the resampling circuit calculating and outputting the second data updated at the edge of the second clock signal, based on the first time interval and the second time interval, and a plurality of the first data updated at the plurality of edges of the first clock signal.

2. The resampling circuit according to claim 1, wherein a first edge of the plurality of edges of the first clock signal occurs before the edge of the second clock signal, a second edge of the plurality of edges of the first clock signal occurs after the edge of the second clock signal, and the second time interval is a time interval between the first edge and the edge of the second clock signal.

3. The resampling circuit according to claim 1, wherein a first edge of the plurality of edges of the first clock signal occurs before the edge of the second clock signal, a second edge of the plurality of edges of the first clock signal occurs after the first edge and before the edge of the second clock signal, and the second time interval is a time interval between the second edge and the edge of the second clock signal.

4. The resampling circuit according to claim 1, wherein the second data updated at the edge of the second clock signal is calculated by approximation based on a relation between the first time interval and the second time interval, and a plurality of the first data updated at the plurality of edges of the first clock signal.

5. The resampling circuit according to claim 4, wherein the approximation is linear approximation.

6. The resampling circuit according to claim 1, comprising a low-pass filter which outputs the first data, wherein a cutoff frequency of the low-pass filter is lower than a Nyquist frequency of the second clock signal.

7. The resampling circuit according to claim 1, wherein the first clock signal is a sampling clock in A/D conversion.

8. The resampling circuit according to claim 1, wherein the second clock signal is a trigger signal inputted from outside to the resampling circuit.

9. A physical quantity sensor unit comprising:
the resampling circuit according to claim 1; and
a physical quantity sensor.

10. The physical quantity sensor unit according to claim 9, wherein
the physical quantity sensor detects at least one of acceleration and angular velocity.

11. A structure monitoring device comprising:
the physical quantity sensor unit according to claim 10;
a receiver which receives a detection signal from the physical quantity sensor unit installed on a structure; and
a calculator which calculates an angle of inclination of the structure, based on a signal outputted from the receiver.

12. An inertial measurement unit comprising:
- a physical quantity sensor which detects at least one of acceleration and angular velocity;
- a signal processing circuit which includes the resampling circuit according to claim 1 and processes a signal outputted from the physical quantity sensor; and
- a communication circuit which transmits inertial data resulting from the processing by the signal processing circuit to outside.

* * * * *